(12) United States Patent
Kimura

(10) Patent No.: US 6,906,541 B2
(45) Date of Patent: Jun. 14, 2005

(54) ELECTRIC RESISTANCE MEASURING CONNECTOR AND MEASURING DEVICE AND MEASURING METHOD FOR CIRCUIT BOARD ELECTRIC RESISTANCE

(75) Inventor: Kiyoshi Kimura, Tokyo (JP)

(73) Assignee: JSR Corporation, Tokyo (JP)

(*) Notice: Subject to any disclaimer, the term of this patent is extended or adjusted under 35 U.S.C. 154(b) by 16 days.

(21) Appl. No.: 10/398,209

(22) PCT Filed: Oct. 31, 2001

(86) PCT No.: PCT/JP01/09540
§ 371 (c)(1),
(2), (4) Date: Apr. 8, 2003

(87) PCT Pub. No.: WO02/37616
PCT Pub. Date: May 10, 2002

(65) Prior Publication Data
US 2004/0012383 A1 Jan. 22, 2004

(30) Foreign Application Priority Data
Nov. 1, 2000 (JP) ..................... 2000-334709

(51) Int. Cl.[7] .............................................. G01R 1/073
(52) U.S. Cl. ...................................... 324/754; 324/757
(58) Field of Search ................................ 324/754, 755, 324/758, 765, 757; 439/86, 91

(56) References Cited

U.S. PATENT DOCUMENTS

| 5,903,162 | A | * | 5/1999 | Cole et al. | .................. | 324/754 |
| 5,973,505 | A | * | 10/1999 | Strid et al. | .................. | 324/754 |
| 6,133,744 | A | * | 10/2000 | Yojima et al. | ................ | 324/754 |
| 6,540,527 | B1 | * | 4/2003 | Tamarkin | ...................... | 439/67 |

FOREIGN PATENT DOCUMENTS

| EP | 1031840 | 8/2000 |
| JP | 9-26446 | 1/1997 |
| JP | 11-204176 | 7/1999 |
| JP | 2000-74965 | 3/2000 |
| JP | 2000-241485 | 9/2000 |

* cited by examiner

Primary Examiner—Ernest Karlsen
(74) Attorney, Agent, or Firm—Oblon, Spivak, McClelland, Maier & Neustadt, P.C.

(57) ABSTRACT

Disclosed herein are a connector for measurement of electric resistance, by which an electric resistance-measuring apparatus capable of surely performing expected measurement of electric resistance with high precision even to a circuit board having small-sized, protruding electrodes to be inspected, a scatter of projected heights of said electrodes being great, and easy to produce can be constructed, and electric resistance-measuring apparatus using this connector and method of measurement.

The connector has a composite electrode sheet having an insulating sheet body in which through-holes have been formed corresponding to electrodes to be inspected, movable electrodes supported movably in a thickness-wise direction within the through-holes, and stationary electrodes each formed in the vicinity of openings of the through-holes on a front surface of the insulating sheet body in a state coming into no contact with the movable electrodes, front-side and back-side anisotropically conductive elastomer layers respectively laminated on the front surface and back surface of the composite electrode sheet, and an external leading terminal electrically connected to the stationary electrodes. The movable and stationary electrodes are electrically connected at the same time to corresponding electrodes to be inspected through the front-side anisotropically conductive elastomer layer.

18 Claims, 11 Drawing Sheets ately, (ii) Japanese Patent Application Laid-Open No.

ELECTRIC RESISTANCE MEASURING CONNECTOR AND MEASURING DEVICE AND MEASURING METHOD FOR CIRCUIT BOARD ELECTRIC RESISTANCE

TECHNICAL FIELD

The present invention relates to a connector for measurement of electric resistance, and electric resistance-measuring apparatus for circuit boards and method of measurement.

BACKGROUND ART

In recent years, with the request for speeding-up of signal transmission in electronic parts, there has been a demand for circuit boards low in electric resistance of wiring between electrodes for fabricating LSI packages such as BGA and CSP. Therefore, it is extremely important to measure the electric resistance of wiring between electrodes of such a circuit board with high precision in electrical inspection of the circuit board.

In the measurement of an electric resistance of a circuit board, there have heretofore been adopted, for example, means in which probes PA and PD for current supply and probes PB and PC for voltage measurement are pressed against and brought into contact with respective 2 electrodes 91 and 92 to be inspected, which have been electrically connected to each other in a circuit board 90 to be inspected, as illustrated in FIG. 22, a current is supplied between the proves PA and PD for current supply from a power supply device 93 in this state, and a voltage signal detected by the probes PB and PC for voltage measurement at this time is processed in an electric signal processor 94, thereby calculating an electric resistance between the electrodes 91 and 92 to be inspected.

In the method described above, however, the surfaces of the electrodes 91 and 92 to be inspected may be damaged by pressing the probes because it is necessary to bring the probes PA and PD for current supply and the probes PB and PC for voltage measurement into contact with the respective electrodes 91 and 92 to be inspected by considerably high pressing force, the probes are made of a metal, and the tips thereof are pointed. Therefore, the circuit board becomes impossible to be used. Under such circumstances, the electric resistance measurement cannot be performed on all circuit boards to be provided as products, and so, so-called sampling inspection has to be performed, and after all, the yield of the products cannot be increased.

In order to solve such a problem, there have heretofore been proposed electric resistance-measuring apparatus in which a connecting member coming into contact with electrodes to be inspected is formed by a conductive elastomer.

For example, (i) Japanese Patent Application Laid-Open No. 26446/1997 discloses an electric resistance-measuring apparatus in which elastic connecting members formed of conductive rubber obtained by binding conductive particles with an elastomer are arranged at electrodes for current supply and electrodes for voltage measurement, respectively, (ii) Japanese Patent Application Laid-Open No. 2000-74965 discloses an electric resistance-measuring apparatus having a common elastic connecting member formed of an anisotropically conductive elastomer, which is provided so as to come into contact with both surfaces of an electrode for current supply and an electrode for voltage measurement electrically connected to the same electrode to be inspected, and (iii) Japanese Patent Application Laid-Open No. 2000-241485 discloses an electric resistance-measuring apparatus comprising a circuit board for inspection on the surface of which a plurality of electrodes for inspection has been formed, and an elastic connecting member formed of a conductive elastomer, which is provided on the surface of the circuit board for inspection, wherein 2 electrodes of the electrodes for inspection are selected in a state that electrodes to be inspected have been electrically connected to the plurality of electrodes for inspection through the connecting member, one of both electrodes is used as an electrode for current supply, and the other is used as an electrode for voltage measurement to measure electric resistance.

According to such electric resistance-measuring apparatus, an electrode for current supply and an electrode for voltage measurement are brought into contact with electrodes to be inspected of a circuit board to be inspected through the elastic connecting member, whereby electrical connection is achieved, so that the measurement of the electric resistance can be conducted without damaging the electrodes to be inspected.

In LSI packages for surface mounting, such as BGA and CSP on the other hand, a wire bonding method, a TAB method, a flip chip mounting method, etc. are known as methods for mounting semiconductor chips on a circuit board making up a package. Among these mounting methods, the flip chip mounting method, which the length of wiring between a semiconductor chip and a circuit board is extremely short, have advantages from the viewpoints of miniaturization of a package and speeding-up of signal transmission.

In such a flip chip mounting method, a circuit board, on a surface of which for mounting semiconductor chips, electrodes have been formed according to a pattern corresponding to an arrangement pattern of pad electrodes of the semiconductor chips, i.e., a plurality of small-sized electrodes of the order of 10 microns have been formed at a fine pitch, is used as the circuit board making up a package, and on one hand, those, on the pad electrodes of which protruding electrodes called solder ball have been formed, are used as the semiconductor chips, wherein the pad electrode of the semiconductor chip is connected to the electrode on the circuit board through the protruding electrode formed on the semiconductor chip, whereby electrical connection between the both is achieved.

There has been recently known a flip chip mounting method in which a circuit board, on a surface for mounting semiconductor chips of which protruding electrodes formed of solder have been formed, is used in place of using the semiconductor chips, on the pad electrodes of which protruding electrodes have been formed.

However, when a measurement of an electric resistance between electrodes is performed as to the circuit boards used in such flip chip mounting methods by means of the electric resistance-measuring apparatus of the above-described constructions (i) to (iii), the following problems are involved.

In the above-described electric resistance-measuring apparatus (i) and (ii), it is necessary to electrically connect both electrode for current supply and electrode for voltage measurement at the same time to each of electrodes to be inspected in a circuit board to be inspected, which is to measure electric resistance, through the elastic connecting member. Thus, in the electric resistance-measurement apparatus for measuring an electric resistance as to a circuit board to be inspected, on which small-sized electrodes to be inspected have been arranged at a high density, it is necessary to form electrodes for current supply and electrodes for voltage measurement in a state separated from one another in a region of an area equal to or smaller than a region occupied by the electrodes to be inspected, i.e., to form electrodes for current supply and electrodes for voltage measurement much smaller in size than the electrodes to be inspected in a state separated from one another at an extremely short distance, according to individual small-sized electrodes to be inspected.

However, it is extremely difficult to manage the above, and after all, it is very difficult to produce an electric resistance-measuring apparatus for measuring the electric resistance of a circuit board having small-sized electrodes at a high density.

On the other hand, in the above-described electric resistance-measuring apparatus (iii), there is no need to form electrodes for current supply and electrodes for voltage measurement corresponding to individual electrodes to be inspected, and so it is easy to produce an electric resistance-measuring apparatus for measuring the electric resistance of a circuit board to be inspected even when small-sized electrodes to be inspected are arranged at a high density in the circuit board to be inspected.

However, such an electric resistance-measuring apparatus is great in measurement error range, and so it is difficult to perform electric resistance measurement as to a circuit board low in electric resistance between electrodes with high precision.

Further, when electric resistance measurement is performed as to a circuit board to be inspected having protruding electrodes to be inspected by means of the electric resistance-measuring apparatus of the above-described constructions (i) to (iii), the following problems are involved.

In the above-described electric resistance-measuring apparatus (i) to (iii), a pressure-sensitive conductive type anisotropically conductive sheet, in which conductive particles exhibiting magnetism are contained in an elastomer in a state oriented so as to align in the thickness-wise direction thereof, is generally used as the elastic connecting member.

On the other hand, in the circuit board having the protruding electrodes, it is difficult to control the height of projection of each electrode for reasons over the production process, and so a scatter of projected heights is generally great. Accordingly, when electric resistance measurement as to the circuit board to be inspected having the protruding electrodes to be inspected is performed, that having high irregularity-absorbing ability, specifically, an anisotropically conductive elastomer having a great thickness is used as the elastic connecting member.

However, the anisotropically conductive elastomer having a great thickness is low in the sensitivity of pressure-sensitive conductivity, and so sufficient conductivity cannot be achieved in the thickness-wise direction of the anisotropically conductive elastomer unless considerably great strain is applied to the anisotropically conductive elastomer in the thickness-wise direction thereof. Therefore, it is difficult to surely achieve the required electrical connection for electrodes to be inspected having a small projected height among a great number of electrodes to be inspected in the circuit board to be inspected, and after all, the prescribed electric resistance measurement as to such a circuit board to be inspected cannot be performed with high precision.

DISCLOSURE OF THE INVENTION

The present invention has been made on the basis of the foregoing circumstances and has as its first object the provision of a connector for measurement of electric resistance, by which an electric resistance-measuring apparatus capable of surely performing expected measurement of an electric resistance on electrodes to be inspected with high precision even in a circuit board which has small-sized, protruding electrodes to be inspected projected from a surface of the circuit board, a scatter of projected heights of said electrodes to be inspected being great, and easy to produce can be constructed.

A second object of the present invention is to provide an electric resistance-measuring apparatus for circuit boards, which can surely perform expected measurement of an electric resistance on electrodes to be inspected with high precision even in a circuit board which has small-sized, protruding electrodes to be inspected projected from a surface of the circuit board, a scatter of projected heights of said electrodes to be inspected being great, and is easy to produce.

A third object of the present invention is to provide an electric resistance-measuring method for circuit boards, which can surely perform expected measurement of electric resistance on electrodes to be inspected with high precision even in a circuit board which has small-sized, protruding electrodes to be inspected projected from a surface of the circuit board, a scatter of projected heights of said electrodes to be inspected being great.

According to the present invention, there is thus provided a connector for measurement of electric resistance, comprising:

a composite electrode sheet having an insulating sheet body in which through-holes extending in a thickness-wise direction of the sheet have been formed at positions corresponding to a pattern of a plurality of electrodes to be inspected in a circuit board to be inspected, the electric resistance of which should be measured, movable electrodes respectively supported movably in the thickness-wise direction of the insulating sheet body within the through-holes in the insulating sheet body, and stationary electrodes formed on a front surface of the insulating sheet body in the vicinity of openings of the through-holes in the insulating sheet body in a state coming into no contact with the movable electrodes;

a front-side anisotropically conductive elastomer layer laminated on the front surface of the composite electrode sheet;

a back-side anisotropically conductive elastomer layer laminated on the back surface of the composite electrode sheet; and an external leading terminal electrically connected to the stationary electrodes in the composite electrode sheet; wherein the movable electrodes and stationary electrodes in the composite electrode sheet are electrically connected at the same time to their corresponding electrodes to be inspected through the front-side anisotropically conductive elastomer layer.

In the connector for measurement of electric resistance according to the present invention, it may be preferred that the through-holes in the insulating sheet body be tapered so as to widen from the front surface toward the back surface of the insulating sheet body, the side wall of each of the movable electrodes be tapered so as to conform to the through-hole in the insulating sheet body, and the movable electrode be supported movably in the thickness-wise direction in such a manner that the side wall thereof separates from and comes into contact with the inner wall surface of the through-hole in the insulating sheet body.

The opening on the front side of each of the through-holes in the insulating sheet body may preferably have a diameter smaller than that of each of the electrodes to be inspected.

The stationary electrodes may preferably be so constructed that each of the stationary electrodes is formed in a region including the vicinity of each of a plurality of the openings of the through-holes in the insulating sheet body, and the stationary electrode is electrically connected to a plurality of the electrodes to be inspected through the front-side anisotropically conductive elastomer layer.

In the connector for measurement of electric resistance according to the present invention, the front-side anisotropically conductive elastomer layer and/or the back-side anisotropically conductive elastomer layer may preferably be formed of a plurality of conductive path-forming portions formed corresponding to a pattern of a plurality of electrodes to be inspected in the circuit board to be inspected, the electric resistance of which should be measured, and extending in the thickness-wise direction, and insulating portions for mutually insulating these conductive path-forming portions.

In such a connector for measurement of electric resistance, the conductive path-forming portions in the front-side anisotropically conductive elastomer layer and/or the back-side anisotropically conductive elastomer layer may preferably contain conductive particles exhibiting magnetism in a state oriented at a high density so as to align in the thickness-wise direction thereof, and the movable electrodes may preferably be composed of a metallic material exhibiting magnetism.

In the connector for measurement of electric resistance according to the present invention, the back-side anisotropically conductive elastomer layer may preferably have a thickness greater than that of the front-side anisotropically conductive elastomer layer.

The back-side anisotropically conductive elastomer layer may preferably have hardness lower than that of the front-side anisotropically conductive elastomer layer.

According to the present invention, there is also provided an electric resistance-measuring apparatus for circuit boards, comprising the above-described connector for measurement of electric resistance arranged on one side of a circuit board to be inspected, the electric resistance of which should be measured, wherein the front-side anisotropically conductive elastomer layer in the connector for measurement of electric resistance is pressed by every one-side-electrodes to be inspected of the circuit board to be inspected, whereby the movable electrodes and stationary electrodes in the connector for measurement of electric resistance are electrically connected at the same time to the respective electrodes to be inspected through the front-side anisotropically conductive elastomer layer so that a measurable state is realized, and in this measurable state, one of the movable electrode and stationary electrode electrically connected to one designated one-side-electrode to be inspected is used as an electrode for current supply, and the other is used as an electrode for voltage measurement, thereby performing measurement of electric resistance as to said designated one-side-electrode to be inspected.

The electric resistance-measuring apparatus for circuit boards according to the present invention may preferably comprise a one-side circuit board for inspection arranged on the back side of the connector for measurement of electric resistance and having a plurality of inspection electrodes arranged respectively corresponding to a plurality of the one-side-electrodes to be inspected of the circuit board to be inspected on its surface, wherein in the measurable state, the respective inspection electrodes are electrically connected to their corresponding movable electrodes through the back-side anisotropically conductive elastomer layer in the connector for measurement of electric resistance.

An other-side circuit board for inspection may preferably be arranged on the other side of the circuit board to be inspected, wherein the other-side circuit board for inspection has an electrode for current supply and an electrode for voltage measurement which are arranged with a space from each other corresponding to each of the other-side-electrodes to be inspected of the circuit board to be inspected and electrically connected to the same other-side-electrode to be inspected of the circuit board to be inspected.

The electric resistance-measuring apparatus for circuit boards according to the present invention may preferably be suitable for use in measurement on a circuit board to be inspected in which one-side-electrodes to be inspected of the circuit board to be inspected are in a protruding form projected from said one side of the circuit board to be inspected.

According to the present invention, there is further provided an electric resistance-measuring method for circuit boards, which comprises arranging the above-described connector for measurement of electric resistance on one side of a circuit board to be inspected, the electric resistance of which should be measured, wherein the front-side anisotropically conductive elastomer layer in the connector for measurement of electric resistance is pressed by every one-side-electrodes to be inspected of the circuit board to be inspected, whereby the movable electrodes and stationary electrodes in the connector for measurement of electric resistance are electrically connected at the same time to the respective electrodes to be inspected through the front-side anisotropically conductive elastomer layer so as to realize a measurable state, and in this measurable state, one of the movable electrode and stationary electrode electrically connected to one designated one-side-electrode to be inspected is used as an electrode for current supply, and the other is used as an electrode for voltage measurement, thereby performing measurement of electric resistance as to the designated one-side-electrode to be inspected.

According to the connector for measurement of electric resistance of the above-described construction, both movable electrode and stationary electrode in the composite electrode sheet are electrically connected to one electrode to be inspected when the front-side anisotropically conductive elastomer layer is pressed by every electrodes to be inspected in the circuit board to be inspected, the electric resistance of which should be measured. In addition, since the stationary electrodes are formed in a state coming into no contact with the movable electrodes, one of the movable electrode and stationary electrode electrically connected to the electrode to be inspected is used as an electrode for current supply, and the other is used as an electrode for voltage measurement, whereby an electric resistance as to the circuit board to be inspected can be measured with high precision.

The movable electrodes in the composite electrode sheet are supported movably in the thickness-wise direction of the insulating sheet body, whereby the movable electrodes are moved in the thickness-wise direction according to the projected heights of the electrodes to be inspected when the front-side anisotropically conductive elastomer layer is pressed by every electrodes to be inspected, so that the irregularity-absorbing ability in each of the front-side anisotropically conductive elastomer layer and back-side anisotropically conductive elastomer layer formed on the front surface and back surface of the composite electrode sheet can be effectively utilized. In addition, the thickness of each of the front-side anisotropically conductive elastomer layer and back-side anisotropically conductive elastomer layer may be small, so that high-sensitivity pressure-sensitive conductivity can be achieved in each of the front-side anisotropically conductive elastomer layer and back-side anisotropically conductive elastomer layer. Accordingly, high connection reliability can be achieved even to a circuit board to be inspected, which has protruding electrodes to be inspected projected from a surface of the circuit board, a scatter of projected heights of said electrodes to be inspected being great, so that the required measurement of electric resistance can be surely performed with high precision.

Since the external leading terminal electrically connected to the stationary electrodes is provided in the composite electrode sheet, the stationary electrodes can be electrically connected to a tester through the external leading terminal, whereby it is only necessary to provide those electrically connected to the movable electrodes as the inspection electrodes. Accordingly, since the inspection electrodes are in corresponding relation of one to one with the electrodes to be inspected of the circuit board to be inspected, these electrodes are only required to have a size substantially equal to the electrodes to be inspected. Accordingly, even when the size of the electrodes to be inspected in the circuit board to be inspected is small, the inspection electrodes corresponding to the electrodes to be inspected can be formed with ease, so that the electric resistance-measuring apparatus can be produced with extreme ease.

BRIEF DESCRIPTION OF THE DRAWINGS

FIG. 12 is a cross-sectional view illustrating a state that a layer formed of an anisotropically conductive elastomer layer-forming material has been formed on a front surface of the composite electrode sheet.

FIG. 13 is a cross-sectional view illustrating a state that a front-side anisotropically conductive elastomer layer has been formed on the front surface of the composite electrode sheet.

| [Description of Characters] | |
|---|---|
| 1 | Circuit board to be inspected, |
| 2 | One-side-electrodes to be inspected, |
| 3 | Other-side-electrodes to be inspected, |
| 5 | Circuit board for inspection, |
| 6 | Inspection electrodes, |
| 10 | Connector for measurement of electric resistance, |
| 11 | Composite electrode sheet, |
| 11A | Laminate material, |
| 12 | Insulating sheet body, |
| 13 | Through-holes, |
| 15 | Movable electrodes, |

-continued

[Description of Characters]

| | |
|---|---|
| 15A | Conductor for movable electrodes, |
| 16 | Stationary electrodes, |
| 16A | Metal layer, |
| 17 | Wiring part, |
| 18 | External leading terminal, |
| 20 | Front-side anisotropically conductive elastomer layer, |
| 20A | Layer formed of an anisotropically conductive elastomer layer-forming material, |
| 21 | Conductive path-forming portions, |
| 22 | Insulating portions, |
| 25 | Back-side anisotropically conductive elastomer layer, |
| 25A | Layer formed of an anisotropically conductive elastomer layer-forming material, |
| 26 | Conductive path-forming portions, |
| 27 | Insulating portions, |
| 30 | One magnetic-pole plate, |
| 31 | Ferromagnetic base plate, |
| 32 | Ferromagnetic layer portions. |
| 33 | Non-magnetic layer portions, |
| 35 | The other magnetic-pole plate, |
| 36 | Ferromagnetic base plate, |
| 37 | Ferromagnetic layer portions, |
| 38 | Non-magnetic layer portions, |
| 40 | Upper-side adaptor, |
| 41 | One-side circuit board for inspection, |
| 42 | Inspection electrodes, |
| 42a | Terminal electrodes, |
| 43 | Connector, |
| 44 | Wiring circuit, |
| 45 | Pressing plate, |
| 46 | Elastic cushioning plate, |
| 47 | Anisotropically conductive sheet, |
| 48 | Electrode plate, |
| 49 | Standard arrangement electrodes, |
| 50 | Lower-side adaptor, |
| 51 | Other-side circuit board for inspection, |
| 52 | Inspection electrodes for current supply, |
| 52a | Terminal electrodes for current supply, |
| 53 | Inspection electrodes for voltage measurement, |
| 53a | Terminal electrodes for voltage measurement, |
| 54 | Connector, |
| 55 | Wiring circuit, |
| 56 | Elastic connecting member, |
| 56a, 56b | Conductive path-forming portions, |
| 56C | Insulating portions, |
| 57 | Holding member, |
| 58 | Pressing plate, |
| 59 | Tester, |
| 60 | Electrode plate, |
| 61 | Standard arrangement electrodes, |
| 62 | Anisotropically conductive sheet, |
| 90 | Circuit board to be inspected, |
| 91, 92 | Electrodes to be inspected, |
| 93 | Power supply device, |
| 94 | Electric signal processor, |
| PA, PD | Probes for current supply, |
| PB and PC | Probes for voltage measurement, |
| G | Insulating region, |
| P | Conductive particles. |

BEST MODE FOR CARRYING OUT THE INVENTION

The embodiments of the present invention will hereinafter be described in details.

<Connector for Measurement of Electric Resistance>

Figure 1:
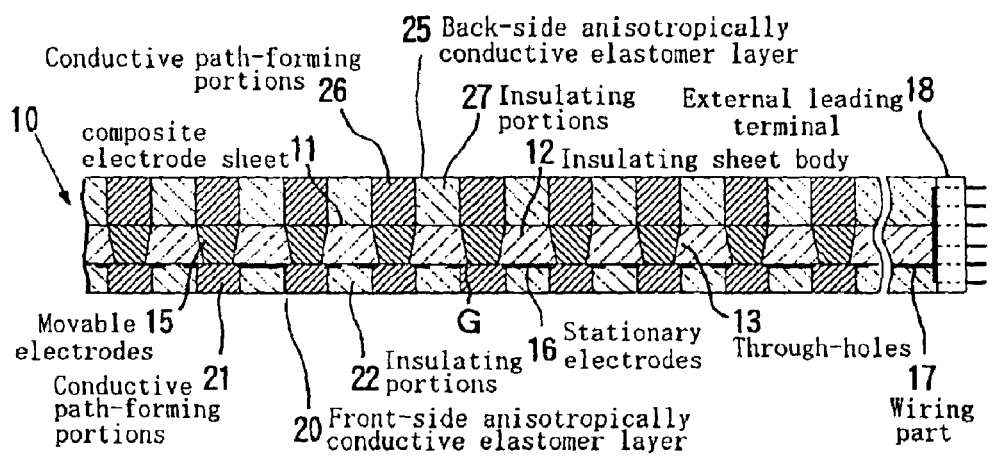
FIG. 1 is a cross-sectional view illustrating the construction of an exemplary connector for measurement of electric resistance according to the present invention.

FIG. 1 is a cross-sectional view illustrating the construction of an exemplary connector for measurement of electric resistance according to the present invention.

This connector 10 for measurement of electric resistance is constructed by a composite electrode sheet 11, a front-side anisotropically conductive elastomer layer 20 integrally stuck and laminated on the front surface (lower surface in FIG. 1) of the composite electrode sheet 11 and exhibiting conductivity in a thickness-wise direction thereof, a back-side anisotropically conductive elastomer layer 25 integrally stuck and laminated on the back surface (upper surface in FIG. 1) of the composite electrode sheet 11, and an external leading terminal 18 provided at an edge of a laminate of these sheet and layers.

The composite electrode sheet 11 has an insulating sheet body 12 in which a plurality of through-holes 13, each extending in the thickness-wise direction have been formed at positions corresponding to electrodes to be inspected of a circuit board to be inspected, the electric resistance of which should be measured. Within each of the through-holes 13 in this insulating sheet body 12, a movable electrode 15 is supported movably in the thickness-wise direction of the insulating sheet body 12 with a space from the insulating sheet body 12. More specifically, each of the through-holes 13 in the insulating sheet body 12 is shaped in the form of a truncated cone that the diameter increases from the front surface toward the back surface (upper surface in FIG. 1) of the insulating sheet body 12, and each of the movable electrodes 15 is shaped in the form of a truncated cone conforming to the through-hole 13 in the insulating sheet body 12. Each of the movable electrodes 15 is supported movably in the thickness-wise direction between the front-side anisotropically conductive elastomer layer 20 and the back-side anisotropically conductive elastomer layer 25 in such a manner that the side wall (tapered surface of the truncated cone) thereof separates from and comes into contact with the inner wall surface (tapered surface) of the through-hole 13 in the insulating sheet body 12.

Figure 2:
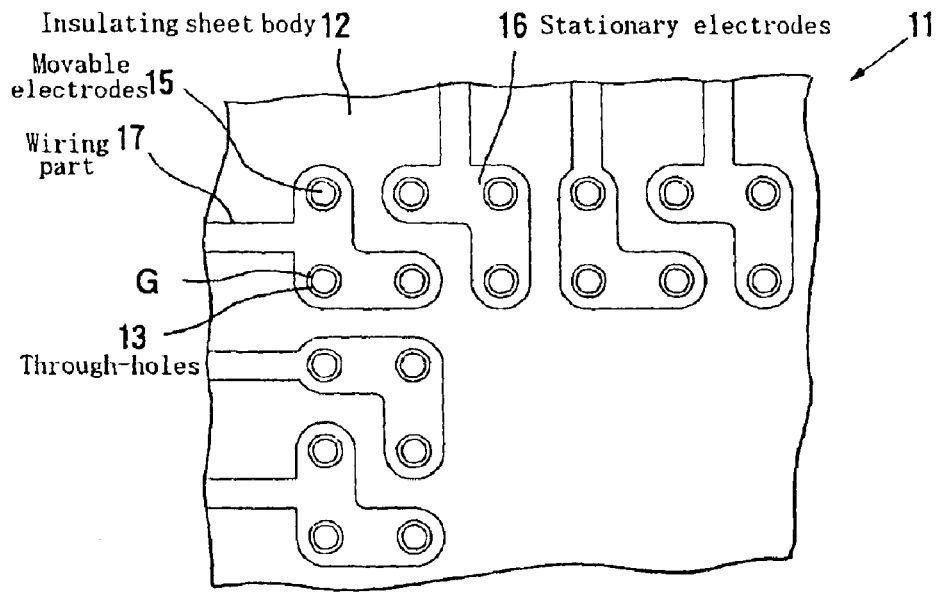
FIG. 2 is a plane view illustrating a principal part of a composite electrode sheet.

On the front surface (lower surface in FIG. 1) of the insulating sheet body 12, a plurality of stationary electrodes 16 composed of, for example, a layer of a metal such as copper are formed in a region including the vicinities of a plurality of the openings of the through-holes 13 in the insulating sheet body 12 in a state coming into no contact with the movable electrodes 15. In this embodiment, each of the stationary electrodes 16 is formed so as to surround the front-side openings of a plurality (for example, 3 holes) of the through-holes 13 through insulating regions G about the openings of the through-holes 13 as illustrated in FIG. 2. Each of the stationary electrodes 16 is electrically connected to the external leading terminal 18 through a wiring part 17 formed on the front surface of the insulating sheet body 12.

As a material for forming the insulating sheet body 12, may be used an elastic polymeric substance or rigid polymeric substance having insulating property.

As examples of the elastic polymeric substance, may be mentioned conjugated diene rubbers such as polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene-diene block copolymer rubber and styrene-isoprene block copolymer rubber and hydrogenated products thereof; and besides chloroprene, urethane rubber, polyester rubber, epichlorohydrin rubber, silicone rubber, ethylene-propylene copolymer rubber and ethylene-propylene-diene copolymer rubber.

As examples of the rigid polymeric substance, may be mentioned thermosetting resins such as polyimide and epoxy resins; polyesters such as polyethylene terephthalate and polybutylene terephthalate; thermoplastic resins such as vinyl chloride resins, polystyrene, polyacrylonitrile, polyethylene, polypropylene, acrylic resins, polybutadiene, poly(phenylene ether), poly(phenylene sulfide), polyamide, polyoxymethylene and liquid crystal polymers.

Among these, the rigid polymeric substances are preferably used. Further, the thermosetting resins are preferably used in that excellent heat resistance and dimensional stability are achieved, with polyimide being particularly preferred.

The thickness of the insulating sheet body 12 is preferably, for example, 20 to 1000 µm, more preferably 30 to 200 µm, particularly preferably 40 to 150 µm. When the thickness falls within this range, the movable electrodes 15 can be caused to function by small pressing force even when they are connected to electrodes extremely small in arrangement pitch.

As a material for forming the movable electrodes 15, any material may be used so far as it is a conductor having certain hardness. For example, a metal such as nickel, iron, cobalt, copper, gold, silver or aluminum, an alloy thereof, a laminate thereof, or a cured product of a conductive paste containing powder of these metals may be used. However, a metal is preferably used in that high conductivity is achieved.

When a front-side anisotropically conductive elastomer layer 20 and a back-side anisotropically conductive elastomer layer 25 in which a plurality of conductive path-forming portions 21 and 26 each containing at a high density conductive particles exhibiting magnetism and extending in the thickness-wise direction of each layer are mutually insulated by insulating portions 22 and 27 from each other, are formed as described below, a metal exhibiting magnetism, such as nickel, iron, cobalt or an alloy thereof is preferably used as the material for forming the movable electrodes 15 in that the conductive particles exhibiting magnetism can be oriented so as to be surely gathered on the front surface and back surface of the movable electrodes 15 and arranged in the thickness-wise direction of each layer by applying a magnetic field.

The front-side anisotropically conductive elastomer layer 20 in this embodiment is formed of a plurality of conductive path-forming portions 21 arranged corresponding to a pattern of electrodes to be inspected in a circuit board to be inspected, the electric resistance of which should be measured, and extending in the thickness-wise direction thereof, and insulating portions 22 interposed between these conductive path-forming portions 21 to mutually insulate these conductive path-forming portions.

Figure 3:
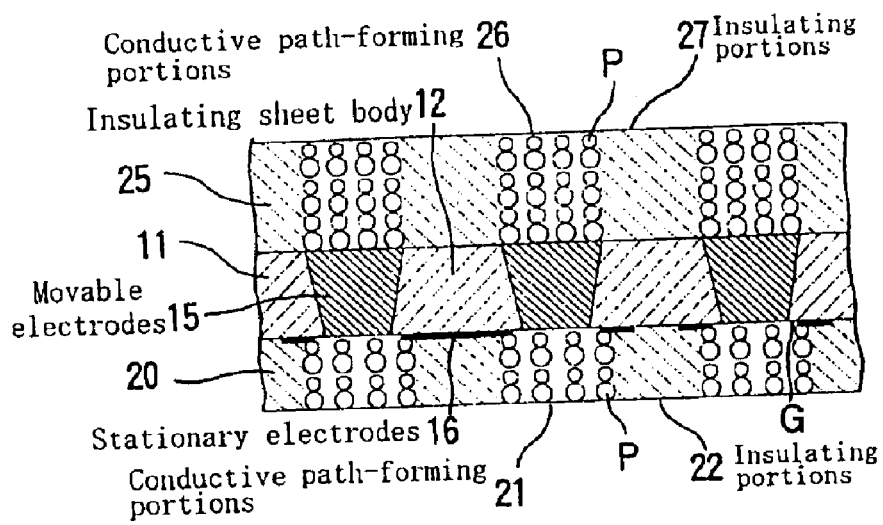
FIG. 3 is a cross-sectional view illustrating, on an enlarged scale, a principal part of the connector for measurement of electric resistance shown in FIG. 1.

The conductive path-forming portions 21 are each formed by causing conductive particles P exhibiting magnetism to be contained at a high density in the elastic polymeric substance making up the base material of the front-side anisotropically conductive elastomer layer 20 in a state oriented so as to align in the thickness-wise direction thereof as typically illustrated in FIG. 3. Conductive paths are formed by respective chains of the conductive particles P. On the other hand, the insulating portions 22 do not contain the conductive particles P at all or scarcely contain them.

The diameter of each of the conductive path-forming portions 21 may be such that both movable electrode 15 and stationary electrode 16 can be electrically connected at the same time to an electrode to be inspected corresponding to the conductive path-forming portion 21, or specifically, it is greater than the diameter of the opening on the front side of the through-hole 13 in the insulating sheet body 12 though the required insulating property between adjacent conductive path-forming portions 21 is surly achieved.

As examples of the conductive particles P making up the conductive path-forming portions 21, may be mentioned particles of metals exhibiting magnetism, such as nickel, iron and cobalt, particles of alloys thereof and particles containing such a metal; particles obtained by using these particles as core particles and plating the core particles with a metal having good conductivity, such as gold, silver, palladium or rhodium; and particles obtained by using particles of a non-magnetic metal, inorganic particles such as glass beads or polymer particles as core particles and plating the core particles with a conductive magnetic material such as nickel or cobalt.

Among these, particles obtained by using nickel particles as core particles and plating them with a metal having good conductivity, such as gold or silver are preferably used.

The particle diameter of the conductive particles P is preferably 3 to 200 µm, particularly 10 to 100 µm in order to achieve easy deformation under pressure of the resulting conductive path-forming portions 21, and to achieve sufficient electrical contact among the conductive particles P in the conductive path-forming portions 21.

The water content in the conductive particles P is preferably at most 5%, more preferably at most 3%, still more preferably at most 2%, particularly preferably at most 1%. The use of the conductive particles satisfying such conditions can prevent or inhibit the occurrence of bubbles in the front-side anisotropically conductive elastomer layer 20 upon the production thereof.

The proportion of the conductive particles P in the conductive path-forming portions 21 is preferably 5 to 60%, more preferably 7 to 50%, particularly preferably 10 to 40% in terms of volume fraction. If this proportion is lower than 5%, it may be difficult in some cases to form conductive paths sufficiently low in electric resistance value. If the proportion exceeds 60% on the other hand, the resulting conductive path-forming portions 21 become brittle, so that elasticity required of the conductive path-forming portions may not be achieved in some cases.

The insulating elastic polymeric substance making up the base material of the front-side anisotropically conductive elastomer layer 20 is preferably a polymeric substance having a crosslinked structure. As a material for the polymeric substance usable for obtaining the polymeric substance having a crosslinked structure, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber and hydrogenated products thereof; block copolymer rubbers such as styrene-butadiene block copolymer rubber and hydrogenated products thereof; silicone rubber, fluorocarbon rubber, silicone-modified fluorocarbon rubber, ethylene-propylene copolymer rubber, urethane rubber, polyester rubber, chloroprene rubber and epichlorohydrin rubber.

Among these, silicone rubber and silicone-modified fluorocarbon rubber are preferably used in that they are high in molding and processing ability and electrical insulating properties.

The back-side anisotropically conductive elastomer layer 25 in this embodiment is formed of a plurality of conductive path-forming portions 26 arranged corresponding to a pattern of electrodes to be inspected in a circuit board to be inspected, the electric resistance of which should be measured, and extending in the thickness-wise direction thereof, and insulating portions 27 interposed between these conductive path-forming portions 261 to mutually insulate these conductive path-forming portions.

The conductive path-forming portions 26 are each formed by causing conductive particles P exhibiting magnetism to be contained at a high density in the elastic polymeric substance making up the base material of the back-side anisotropically conductive elastomer layer 25 in a state oriented so as to align in the thickness-wise direction thereof as typically illustrated in FIG. 3. Conductive paths are formed by respective chains of the conductive particles P. On the other hand, the insulating portions 27 do not contain the conductive particles P at all or scarcely contain them.

As the conductive particles P making up the conductive path-forming portions 26 and the insulating elastic polymeric substance making up the base material of the back-side anisotropically conductive elastomer layer 25, may be used the same particles and substance as those used in the front-side anisotropically conductive elastomer layer 20.

In the connector for measurement of electric resistance according to the present invention, the front-side anisotropically conductive elastomer layer 20 and the back-side anisotropically conductive elastomer layer 25 preferably satisfy one or both of the following relationships (a) and (b).

(a) The back-side anisotropically conductive elastomer layer 25 has a thickness greater than that of the front-side anisotropically conductive elastomer layer 20. Specifically, supposing that the thickness of the front-side anisotropically conductive elastomer layer 20 is T1, and the thickness of the back-side anisotropically conductive elastomer layer 25 is T2, the relationship, $1<(T2/T1)\leqq3$, is satisfied.

(b) The back-side anisotropically conductive elastomer layer 25 has hardness lower than that of the front-side anisotropically conductive elastomer layer 20. Specifically, supposing that the hardness of the front-side anisotropically conductive elastomer layer 20 is D1, and the hardness of the back-side anisotropically conductive elastomer layer 25 is D2, the relationship, $0.5\leqq(D2/D1)<1$, is satisfied.

The front-side anisotropically conductive elastomer layer 20 and the back-side anisotropically conductive elastomer layer 25 satisfy one or both of the relationships (a) and (b), whereby the movable electrodes 15 are surely moved in a direction toward the back surface from the front surface of the insulating sheet body, namely, a direction pressing the back-side anisotropically conductive elastomer layer 25 when the front-side anisotropically conductive elastomer layer 20 is pressed by electrodes to be inspected in a circuit board to be inspected, the electric resistance of which should be measured. Accordingly, the elasticity of both front-side anisotropically conductive elastomer layer 20 and back-side anisotropically conductive elastomer layer 25 can be effectively utilized, so that the required electrical connection between electrodes to be inspected and inspection electrodes can be more surely achieved even in a circuit board to be inspected having a scatter of projected heights of the electrodes to be inspected in a great degree.

The total thickness (T1+T2) of the front-side anisotropically conductive elastomer layer 20 and the back-side anisotropically conductive elastomer layer 25 is, for example, 0.15 to 3 mm.

The thickness (T1) of the front-side anisotropically conductive elastomer layer 20 is, for example, 0.05 to 1 mm, and the thickness (T2) of the back-side anisotropically conductive elastomer layer 25 is, for example, 0.1 to 2 mm.

The above-described connector for measurement of electric resistance can be produced, for example, in the following manner.

Figure 4:
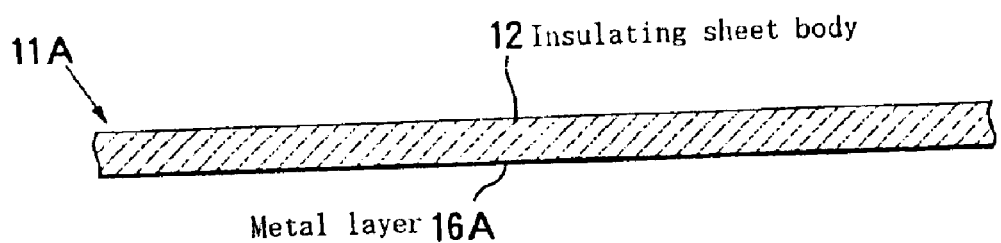
FIG. 4 is a cross-sectional view illustrating a laminate material for producing a connector for measurement of electric resistance.
Figure 5:
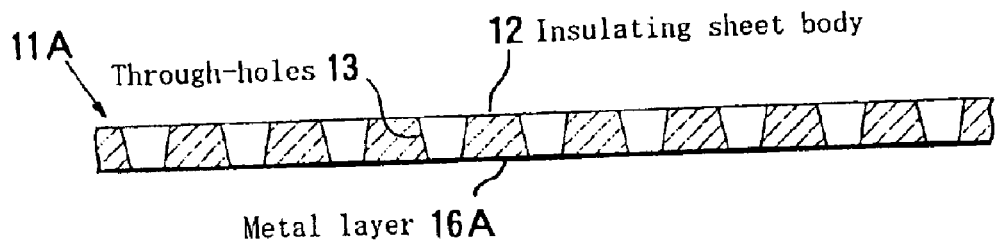
FIG. 5 is a cross-sectional view illustrating a state that through-holes have been made in an insulating sheet body in the laminate material shown in FIG. 4.

As illustrated in FIG. 4, a laminate material 11A obtained by forming a metal layer 16A on the front surface (lower surface in FIG. 4) of an insulating sheet body 12 is first provided, and a plurality of through-holes 13 tapered so as to widen from the front surface toward the back surface of the insulating sheet body, or specifically, having a form of a truncated cone and extending in the thickness-wise direction of the sheet body are formed in the insulating sheet body 12 in this laminate material 11A according to a pattern corresponding to a pattern of electrode to be inspected in a circuit board to be inspected, the electric resistance of which should be measured, as illustrated in FIG. 5.

Figure 6:
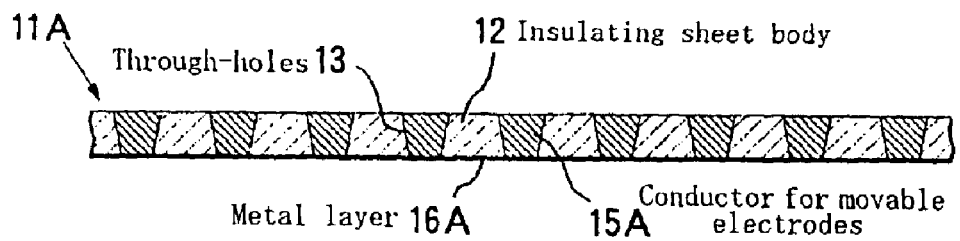
FIG. 6 is a cross-sectional view illustrating a state that conductors for movable electrodes have been formed within the through-holes in the insulating sheet body in the laminate material.
Figure 7:
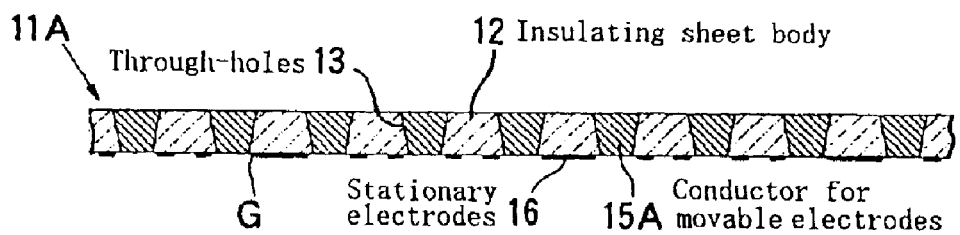
FIG. 7 is a cross-sectional view illustrating a state that stationary electrodes have been formed on a front surface of the insulating sheet body.

Conductors 15A for movable electrodes in the form of a truncated cone are then formed in a state charged into the respective through-holes 13 in the insulating sheet body 12 of the laminate material 11A as illustrated in FIG. 6. Thereafter, stationary electrodes 16 of the required pattern and a wiring part (not illustrated) are formed by subjecting the metal layer 16A to an etching treatment to remove portions thereof as illustrated in FIG. 7. An insulating region G is present between each of the stationary electrodes 16 and each of the conductors 15A for movable electrodes formed herein. Accordingly, the stationary electrode 16 is in a state coming into no contact with the conductor 15A for a movable electrode.

As a means for making the through-holes 13 in the insulating sheet body 12 in the above process, may be used a laser processing method, dry etching method or the like. However, the laser processing method is preferred in that the through-holes 13 of tapered shape can be formed with ease.

As a method for forming the conductors 15A for movable electrodes, may be used (1) a method in which the metal layer 16A is used as a common cathode electrode to deposit and fill a metal into the through-holes 13 in the insulating sheet body 12 by electroplating, (2) a method in which a conductive paste containing metal powder is filled into the through-holes 13 in the insulating sheet body 12, and the conductive paste is then subjected to a curing treatment, or the like. However, the method (1) is preferred in that conductors 15A for movable electrodes composed of only a metal having high conductivity can be formed.

A back-side anisotropically conductive elastomer layer 25 is formed on a back surface (upper surface in the figure) of the insulating sheet body 12 within the through-holes 13 of which the conductors 15A for movable electrodes have been formed.

Figure 8:
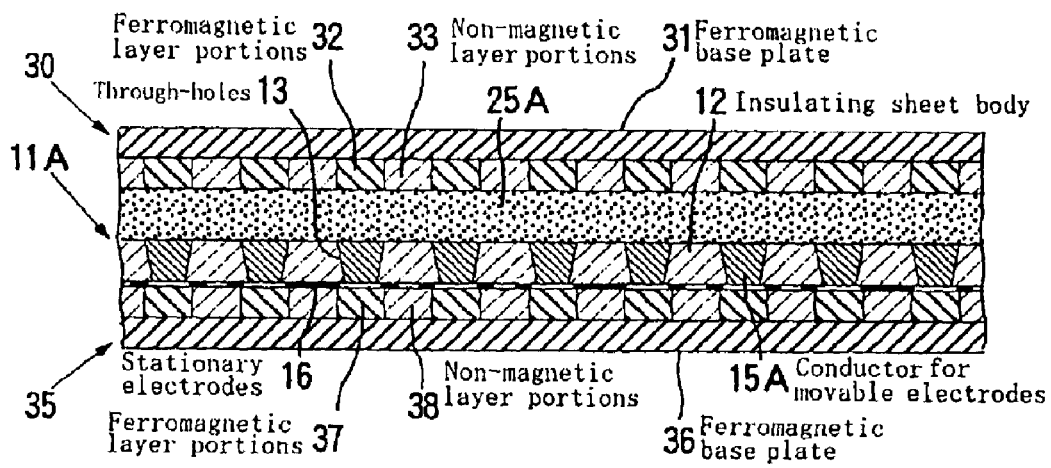
FIG. 8 is a cross-sectional view illustrating a state that a layer formed of an anisotropically conductive elastomer layer-forming material has been formed on a back surface of the insulating sheet body.

Specifically, a layer (hereinafter referred to as "elastomer-forming material layer") 25A formed of an anisotropically conductive elastomer layer-forming material with conductive particles exhibiting magnetism contained in a liquid material for a polymeric substance, which will become an insulating elastic polymeric substance by curing, and having the required thickness is formed on back surfaces of the insulating sheet body 12 and the conductors 15A for movable electrodes formed within the through-holes 13, and one magnetic-pole plate 30 and the other magnetic-pole plate 35 for forming an anisotropically conductive elastomer layer are arranged on the upper surface of the elastomer-forming material layer 25A and the lower surface of the insulating sheet body 12, respectively as illustrated in FIG. 8.

In said one magnetic-pole plate 30, ferromagnetic layer portions 32 are formed according to a pattern conforming to a pattern of conductive path-forming portions to be formed on a lower surface of a ferromagnetic base plate 31, and non-magnetic layer portions 33 are formed at other places than the places at which the ferromagnetic layer portions 32 have been formed.

In the other magnetic-pole plate 35, ferromagnetic layer portions 37 are formed according to the same pattern as a pattern of conductive path-forming portions to be formed on an upper surface of a ferromagnetic base plate 36, and non-magnetic layer portions 38 are formed at other places than the places at which the ferromagnetic layer portions 37 have been formed.

Figure 9:
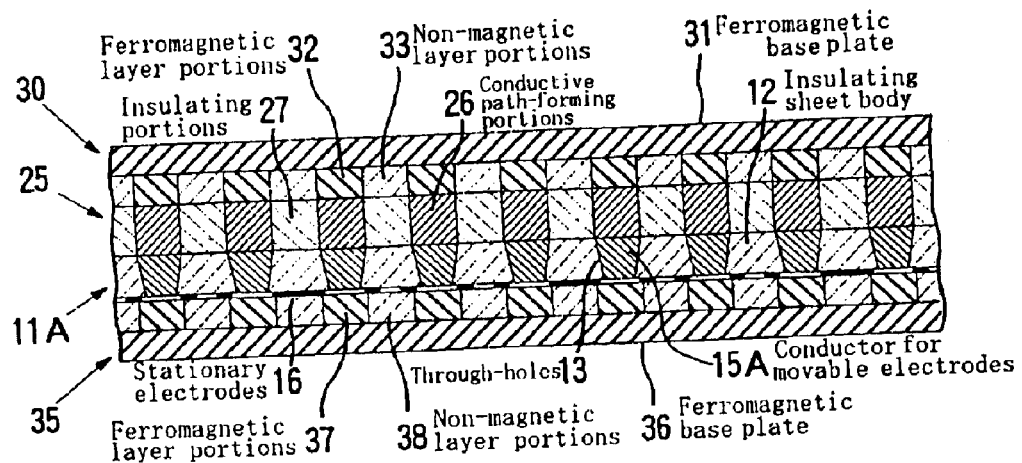
FIG. 9 is a cross-sectional view illustrating a state that a back-side anisotropically conductive elastomer layer has been formed on the back surface of the insulating sheet body.

Electromagnets, for example, are then arranged on the upper surface of said one magnetic-pole plate 30 and the lower surface of the other magnetic-pole plate 35, and electromagnets are operated, thereby applying a parallel magnetic field to the elastomer-forming material layer 25A in the thickness-wise direction thereof through said one magnetic-pole plate 30 and the other magnetic-pole plate 35. As a result, the conductive particles exhibiting magnetism dispersed in the elastomer-forming material layer 25A are gathered at portions located between the ferromagnetic layer portions 32 of said one magnetic-pole plate 30 and the ferromagnetic layer portions 37 of the other magnetic-pole plate 35, and at the same time oriented so as to align in the thickness-wise direction of the elastomer-forming material layer. In this state, the elastomer-forming material layer is subjected to a curing treatment, whereby a back-side anisotropically conductive elastomer layer 25 comprising a plurality of conductive path-forming portions 26, in which the conductive particles are filled at a high density, and insulating portions 27 for mutually insulating these conductive path-forming portions is formed on the back surface of the insulating sheet body 12 in a state integrally stuck as illustrated in FIG. 9.

In the above-described process, a curing catalyst for curing the material for the polymeric substance may be contained in the anisotropically conductive elastomer layer-forming material. As such a curing catalyst, may be used an organic peroxide, fatty acid azo compound, hydrosilylated catalyst or the like.

Specific examples of the organic peroxide used as the curing catalyst include benzoyl peroxide, bisdicyclobenzoyl peroxide, dicumyl peroxide and di-tert-butyl peroxide.

Specific examples of the fatty acid azo compound used as the curing catalyst include azobisisobutyronitrile.

Specific examples of that used as the catalyst for hydrosilylation reaction include publicly known catalysts such as platinic chloride and salts thereof, platinum-unsaturated group-containing siloxane complexes, vinylsiloxane-platinum complexes, platinum-1,3-divinyltetramethyldisiloxane complexes, complexes of triorganophosphine or phosphine and platinum, acetyl acetate platinum chelates, and cyclic diene-platinum complexes.

The amount of the curing catalyst used is suitably selected in view of the kind of the material for the polymeric substance, the kind of the curing catalyst and other conditions for the curing treatment. However, it is generally 3 to 15 parts by weight per 100 parts by weight of the material for the polymeric substance.

In the anisotropically conductive elastomer layer-forming material, may be contained a general inorganic filler such as silica powder, colloidal silica, aerogel silica or alumina as needed. By containing such an inorganic filler, the thixotropic property of the forming material is ensured, the viscosity thereof becomes high, the dispersion stability of the conductive particles is improved, and moreover the strength of the resulting anisotropically conductive elastomer layer can be made high.

No particular limitation is imposed on the amount of such an inorganic filler used. However, the use in a large amount is not preferred because the orientation of the conductive particles by a magnetic field cannot be fully achieved.

The viscosity of the anisotropically conductive elastomer layer-forming material is preferably within a range of from 100,000 to 1,000,000 cP at a temperature of 25° C.

No particular limitation is imposed on a method for forming the elastomer-forming material layer 25A. However, for example, a roll coating method, a blade coating method or a printing method such as screen printing may be used.

The curing treatment of the elastomer-forming material layer 25A may be conducted in the state that the parallel magnetic field has been applied. However, the treatment may also be conducted after stopping the application of the parallel magnetic field. The intensity of the parallel magnetic field applied to the elastomer-forming material layer 25A is preferably an intensity that it amounts to 0.02 to 1 T on the average.

As a means for applying the parallel magnetic field, permanent magnets may also be used in place of the electromagnets. As such permanent magnets, are preferred those composed of alunico (Fe—Al—Ni—Co alloy), ferrite or the like in that the intensity of the parallel magnetic field within the above range is achieved.

When a metallic material exhibiting magnetism is used as a material for forming the conductors 15A for movable electrodes, the conductive path-forming portions 21 can be surely formed at places at which the conductors 15A for movable electrodes are located, since the conductors 15A for movable electrodes function as a magnetic pole.

Conditions for the curing treatment of the elastomer-forming material layer 25A are suitably selected according to the material used. However, the treatment is generally conducted by a heat treatment. Specific heating temperature and heating time are suitably selected in view of the kinds of the material for the polymeric substance making up the elastomer-forming material layer 25A, the time required for movement of the conductive particles, and the like. For example, when the material for the polymeric substance is room temperature-curing type silicone rubber, the curing treatment is performed for about 24 hours at room temperature, for about 2 hours at 40° C. or for about 30 minutes at 80° C.

Figure 10:
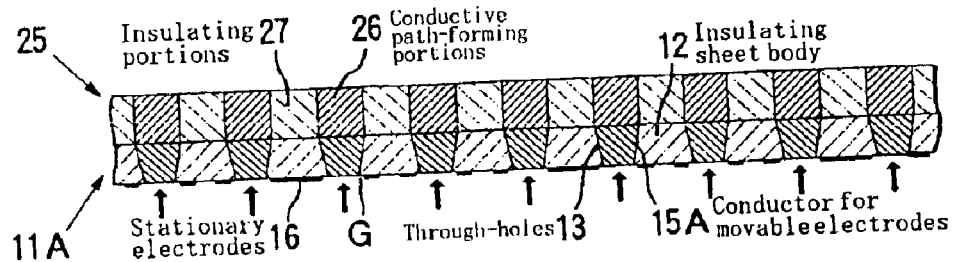
FIG. 10 is a cross-sectional view illustrating a state that the conductors for movable electrodes have been pressed in a direction toward the back surface from the front surface of the insulating sheet body.
Figure 11:
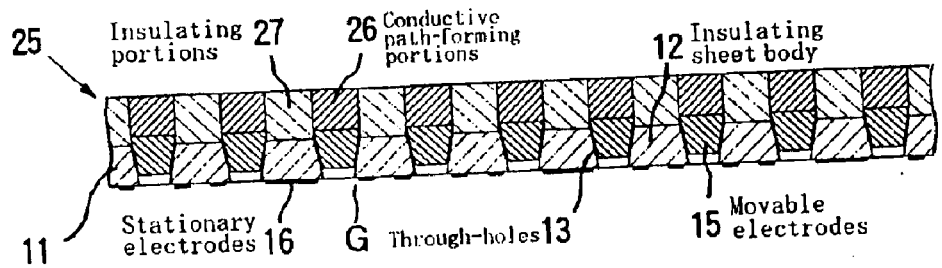
FIG. 11 is a cross-sectional view illustrating a state that the conductors for movable electrodes have been separated from the insulating sheet body to form movable electrodes.
Figure 1:
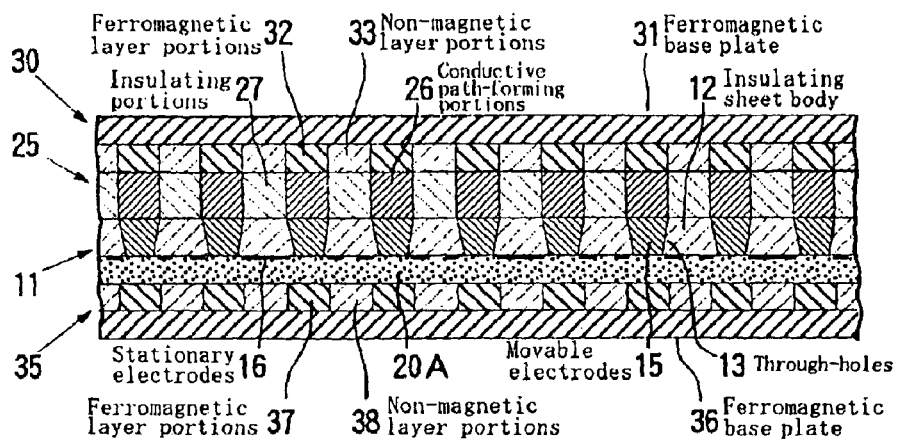
Figure 1:
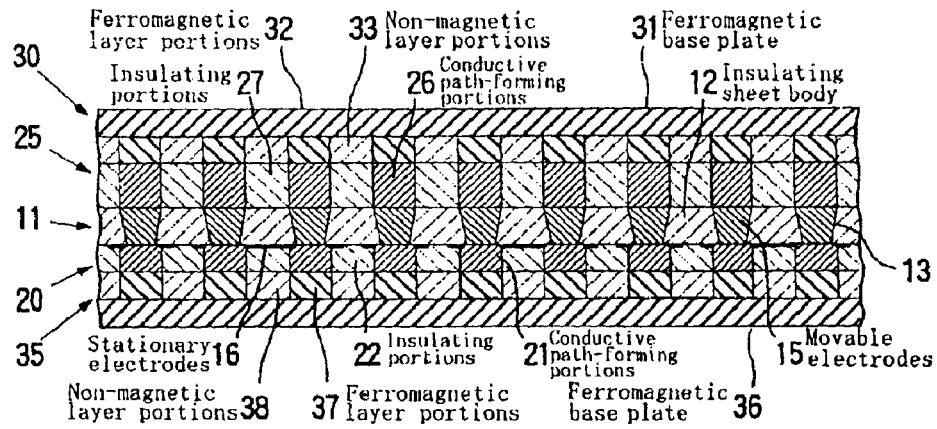

After the back-side anisotropically conductive elastomer layer 25 is formed on the back surface of the insulating sheet body 12 in the above-described manner, when the conductors 15A for the movable electrodes are pressed in a direction toward the back surface from the front surface as illustrated in FIG. 10, the conductors 15A for the movable electrodes are easily separated from the insulating sheet body 12 because adhesion of the conductors 15A for the movable electrodes to the insulating sheet body 12 is low. As a result, the movable electrodes 15 movable in the thickness-wise direction so as to separate from and come into contact with the inner wall surface of their corresponding through-holes 13 in the insulating sheet body 12 are formed as illustrated in FIG. 11, thereby the composite electrode sheet 11 is formed.

An elastomer-forming material layer 20A is then formed on the front surface (front surfaces of the insulating sheet body 12 and of the movable electrodes 15) of the composite electrode sheet 11 as illustrated in FIG. 12, and one magnetic-pole plate 30 and the other magnetic-pole plate 35 for forming an anisotropically conductive elastomer layer are arranged on the upper surface of the back-side anisotropically conductive elastomer layer 25 and the lower surface of the elastomer-forming material layer 20A, respectively.

Electromagnets, for example, are then arranged on the upper surface of said one magnetic-pole plate 30 and the lower surface of the other magnetic-pole plate 35, and the electromagnets are operated, thereby applying a parallel magnetic field to the elastomer-forming material layer 20A in the thickness-wise direction thereof through said one magnetic-pole plate 30 and the other magnetic-pole plate 35. As a result, the conductive particles exhibiting magnetism dispersed in the elastomer-forming material layer 20A are gathered at portions located between the ferromagnetic layer portions 32 of said one magnetic-pole plate 30 and the ferromagnetic layer portions 37 of the other magnetic-pole plate 35, and at the same time oriented so as to align in the thickness-wise direction of the elastomer-forming material layer. In this state, the elastomer-forming material layer is subjected to a curing treatment, whereby a front-side anisotropically conductive elastomer layer 20 comprising a plurality of conductive path-forming portions 21, in which the conductive particles are filled at the high density, and insulating portions 22 for mutually insulating these conductive path-forming portions is formed on the front surface of the composite electrode sheet 11 in a state integrally stuck as illustrated in FIG. 13.

In the above-described process, the parallel magnetic field applied to the elastomer-forming material layer 20A and the conditions for the curing treatment of the elastomer-forming material layer 20A are the same as in the formation of the back-side anisotropically conductive elastomer layer 25A.

Thereafter, an external leading terminal connected to the wiring part of the composite electrode sheet 11 is provided at an edge of a laminate with the front-side anisotropically conductive elastomer layer 20 and the back-side anisotropically conductive elastomer layer 25 formed on the front surface and back surface of the composite electrode sheet 11, respectively, thereby the connector 10 for measurement of electric resistance as illustrated in FIG. 1 is produced.

Figure 14:
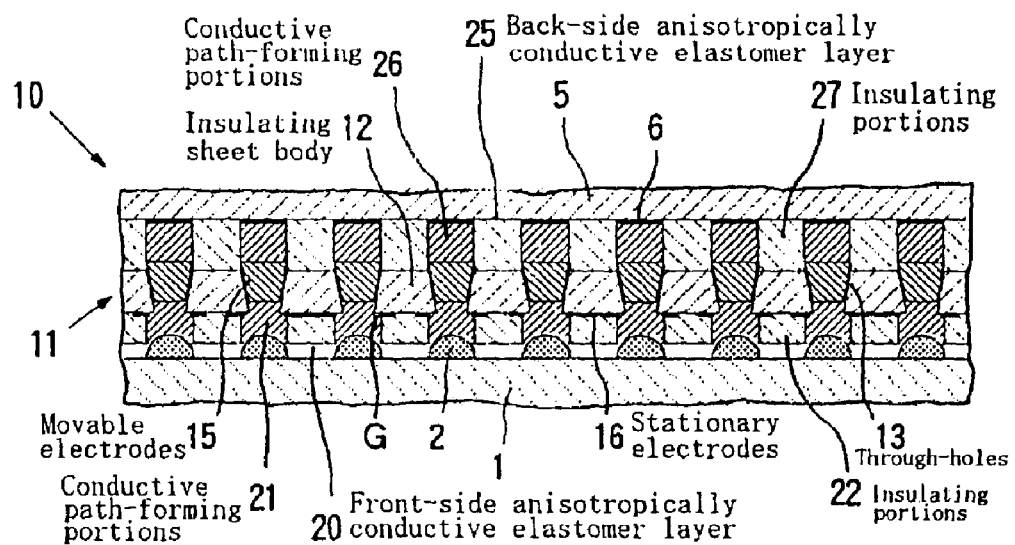
FIG. 14 is a cross-sectional view illustrating a state that the front-side anisotropically conductive elastomer layer in the connector for measurement of electric resistance has been pressed by one-side-electrodes to be inspected of a circuit board to be inspected.

The above-described connector 10 for measurement of electric resistance is used by arranging it between a plurality of one-side-electrodes 2 to be inspected arranged on one side of a circuit board to be inspected, the electric resistance of which should be measured, and inspection electrodes 6 arranged according to a pattern corresponding to the arrangement pattern of the one-side-electrodes 2 to be inspected on an surface of a circuit board 5 for inspection as illustrated in FIG. 14. The one-side-electrodes 2 to be inspected on the circuit board 1 to be inspected in the embodiment illustrated are in the form of a semi-sphere projected from said one side of the circuit board 1 to be inspected.

As the conductive path-forming portions 21 of the front-side anisotropically conductive elastomer layer 20 and the conductive path-forming portions 26 of the back-side anisotropically conductive elastomer layer 25 are pressed by the one-side-electrodes 2 to be inspected and the inspection electrodes 6, the movable electrodes 15 and stationary electrodes 16 are electrically connected at the same time to their corresponding one-side-electrodes 2 to be inspected through the conductive path-forming portions 21 of the front-side anisotropically conductive elastomer layer 20, and further the inspection electrodes 6 are electrically connected to their corresponding movable electrodes 15 through the conductive path-forming portions 26 of the back-side anisotropically conductive elastomer layer 25. At this time, the movable electrodes 15 are moved in a direction toward the back surface from the front surface of the insulating sheet body 12 according to the projected heights of the one-side-electrodes 2 to be inspected by the pressing force transmitted through the conductive path-forming portions 21 of the front-side anisotropically conductive elastomer layer 20.

Under such a state, one of a plurality of the one-side-electrodes 2 to be inspected in the circuit board to be inspected is designated, and one of the movable electrode 15 and stationary electrode 16 electrically connected to this designated one-side-electrode 2 to be inspected is used as an electrode for current supply, and the other is used as an electrode for voltage measurement, thereby performing measurement of an electric resistance as to the designated electrode to be inspected.

According to the connector 10 for measurement of electric resistance of the above-described construction, both movable electrode 15 and stationary electrode 16 in the composite electrode sheet 11 are electrically connected at the same time to one of the one-side-electrodes 2 to be inspected when the front-side anisotropically conductive elastomer layer 20 is pressed by the individual one-side-electrodes 2 to be inspected of the circuit board 1 to be inspected, the electric resistance of which should be measured. In addition, since the stationary electrode 16 is formed in a state coming into no contact with the movable electrode 15 by the insulating region G, the electric resistance as to the circuit board 1 to be inspected can be measured with high precision by using one of the movable electrode 15 and stationary electrode 16 electrically connected to the one-side-electrode 2 to be inspected as an electrode for current supply, and using the other as an electrode for voltage measurement.

The movable electrodes 15 in the composite electrode sheet 11 are supported movably in the thickness-wise direction of the insulating sheet body 12, whereby the movable electrodes 15 are moved in the thickness-wise direction according to the projected heights of their corresponding one-side-electrodes 2 to be inspected when the front-side anisotropically conductive elastomer layer 20 is pressed by the one-side-electrodes 2 to be inspected, so that the irregularity-absorbing ability of each of front-side anisotropically conductive elastomer layer 20 and back-side anisotropically conductive elastomer layer 25 formed on the front surface and back surface of the composite electrode sheet 11, respectively, can be effectively utilized. In addition, high-sensitivity pressure-sensitive conductivity can be achieved in each of the front-side anisotropically conductive elastomer layer 20 and the back-side anisotropically conductive elastomer layer 25 since both front-side anisotropically conductive elastomer layer 20 and back-side anisotropically conductive elastomer layer 25 may be small in thickness. Accordingly, high connection reliability can be achieved even to a circuit board 1 to be inspected, which has protruding one-side-electrodes 2 to be inspected projected from one surface of the circuit board, a scatter of projected heights of said one-side-electrodes 2 to be inspected being great, so that the required measurement of electric resistance can be surely performed.

Since the external leading terminal 18 electrically connected to the stationary electrodes 16 is provided to the composite electrode sheet 11, the stationary electrodes 16 can be electrically connected to a tester through the external leading terminal 18, whereby only those electrically connected to the movable electrodes 15 through the back-side anisotropically conductive elastomer layer 25 may be provided as the inspection electrodes 6. Accordingly, it is only necessary for the inspection electrodes 6 to be in corresponding relation of one to one with the one-side-electrodes 2 to be inspected of the circuit board 1 to be inspected, so that these electrodes are only required to have a size substantially equal to the one-side-electrodes 2 to be inspected. Therefore, even when the size of the one-side-electrodes 2 to be inspected in the circuit board 1 to be inspected is small, the inspection electrodes 6 corresponding to the one-side-electrodes 2 to be inspected can be formed with ease, so that the electric resistance-measuring apparatus can be produced with extreme ease.

The connector for measurement of electric resistance according to the present invention is not limited to the above-described embodiments, and such various modifications as described below may be added thereto.

(1) The shapes of the through-holes 13 in the insulating sheet body 12 and the movable electrodes 15 may be any other shapes than the truncated cone so far as the movable electrodes 15 may be supported movably in the thickness-wise direction of the sheet body.

(2) It is not essential for the front-side anisotropically conductive elastomer layer 20 and the back-side anisotropically conductive elastomer layer 25 to be integrally stuck on the insulating sheet body 12, and other bodies separable from the insulating sheet body 12 may also be fixed to the insulating sheet body 12 by proper means.

Figure 15:
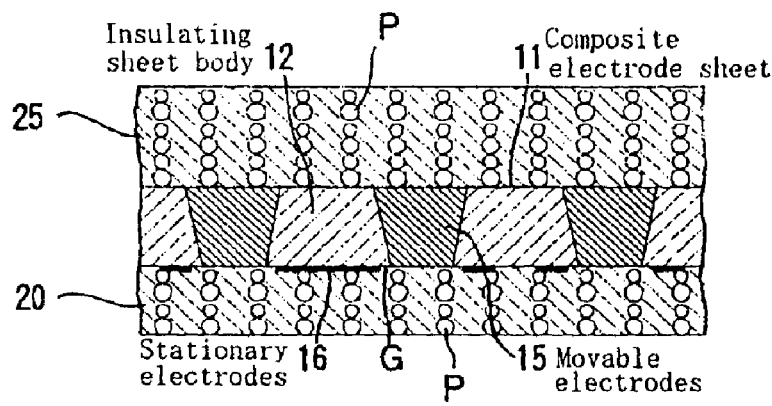
FIG. 15 is a cross-sectional view illustrating, on an enlarged scale, a principal part of another embodiment of a connector for measurement of electric resistance according to the present invention.

(3) The front-side anisotropically conductive elastomer layer 20 and the back-side anisotropically conductive elastomer layer 25 are not limited to those of the so-called uneven distribution type that a plurality of the conductive path-forming portions 21, 26 are arranged in a state insulated mutually by the insulating portions 22, 27, and may be those of the so-called dispersed type that conductive particles P are contained in an elastic polymeric substance forming a base material of an anisotropically conductive elastomer layer in a state oriented so as to arrange in rows in a thickness-wise direction of the elastomer layer, and dispersed in a plane direction thereof as typically illustrated in FIG. 15.

(4) The stationary electrodes 16 may also be formed corresponding to the respective one-side-electrodes 2 to be inspected so as to surround only an opening on the front side of one through-hole 13 in the insulating sheet body 12. In such construction, each of the stationary electrodes 16 may be electrically connected to the external leading terminal 18 by an independent wiring part 17, or a plurality of the stationary electrodes 16 may also be electrically connected to the external leading terminal 18 by a common wiring part 17. A stationary electrode 16 may also be formed so as to surround openings on the front side of all the through-holes 13.

<Electric Resistance-measuring Apparatus for Circuit Board>

Figure 16:
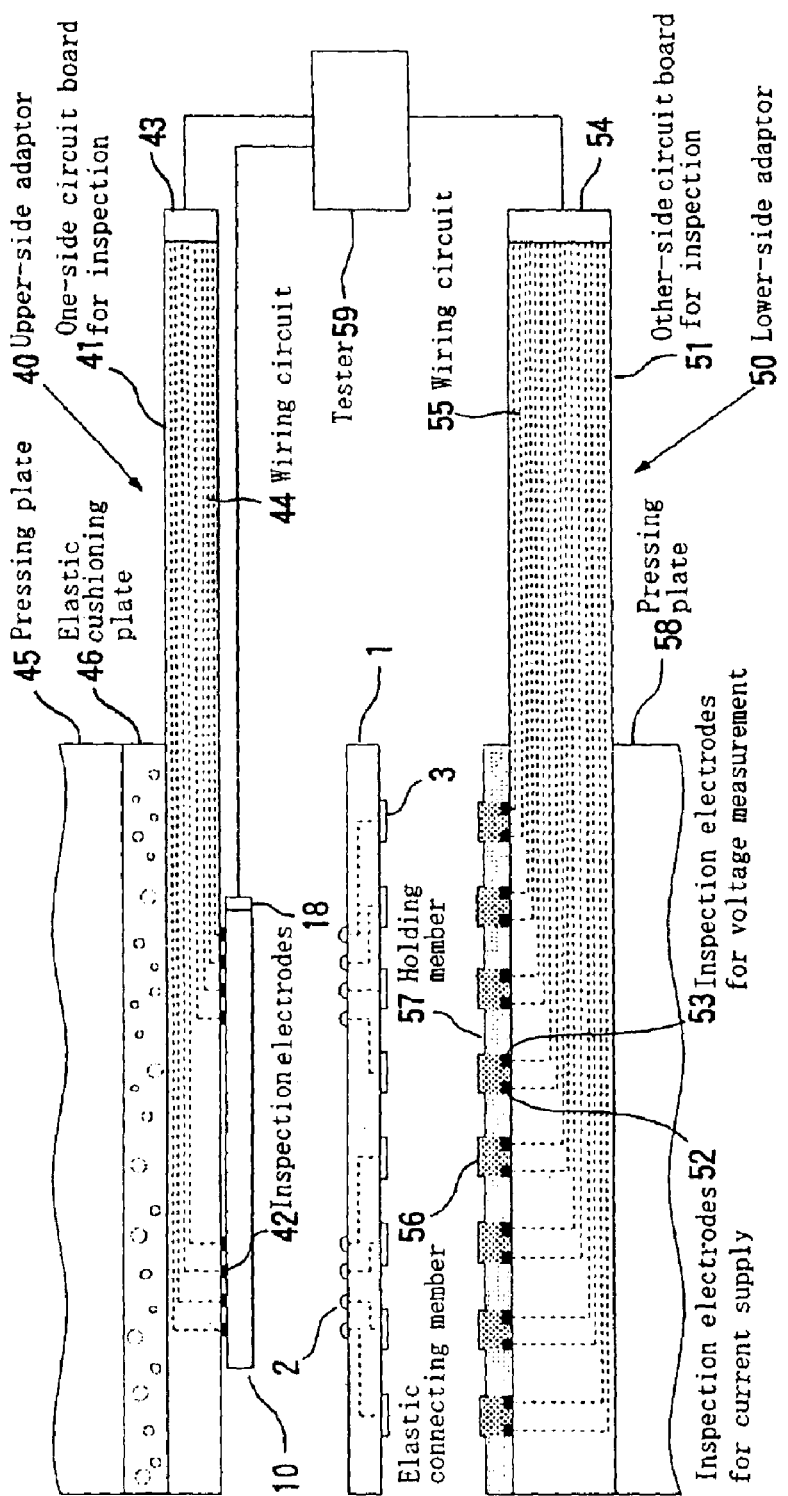
FIG. 16 is a cross-sectional view schematically illustrating the construction of an embodiment of an electric resistance-measuring apparatus for circuit boards according to the present invention together with a circuit board to be inspected.
Figure 17:
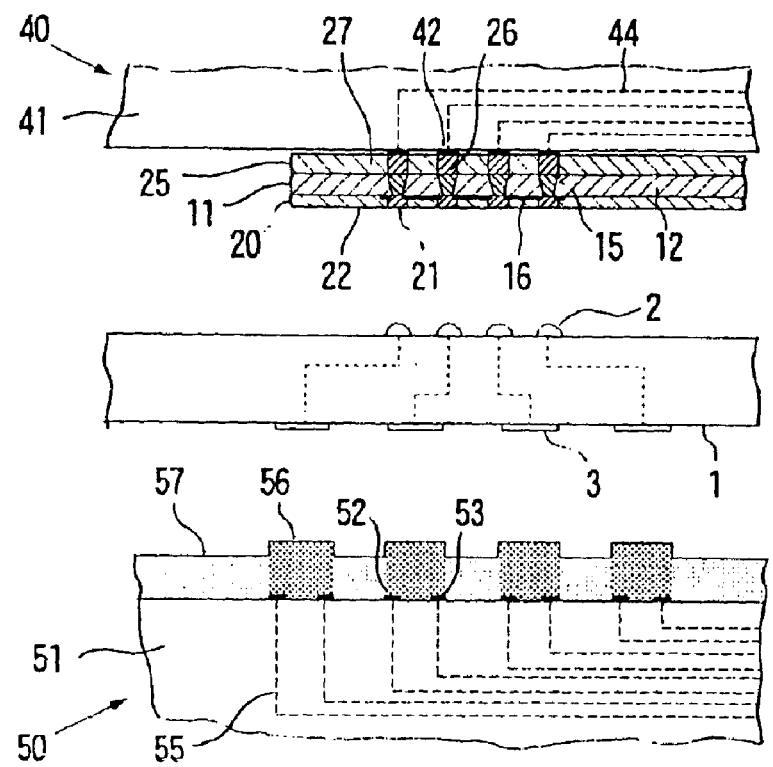
FIG. 17 is a cross-sectional view, on an enlarged scale, illustrating a principal part of the electric resistance-measuring apparatus for circuit boards shown in FIG. 16.

FIG. 16 illustrates the construction of an electric resistance-measuring apparatus for circuit boards according to an embodiment of the present invention, and FIG. 17 is a explanatory view, on an enlarged scale, illustrating a principal part of the electric resistance-measuring apparatus for circuit boards shown in FIG. 16.

This electric resistance-measuring apparatus for circuit boards is constructed by vertically arranging an upper-side adaptor 40 arranged on one side (upper surface in FIG. 16) of a circuit board 1 to be inspected, the electric resistance of which should be measured, and a lower side adaptor 50 arranged on the other side (lower surface in FIG. 16) of the circuit board 1 to be inspected in opposed relation to each other.

Figure 18:
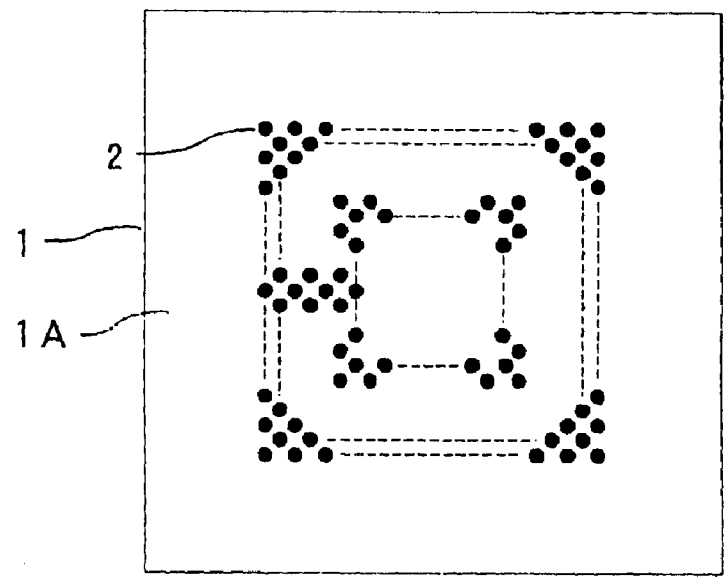
FIG. 18 illustrates the arranged state of one-side-electrodes to be inspected of a circuit board to be inspected, the electric resistance of which should be measured.
Figure 19:
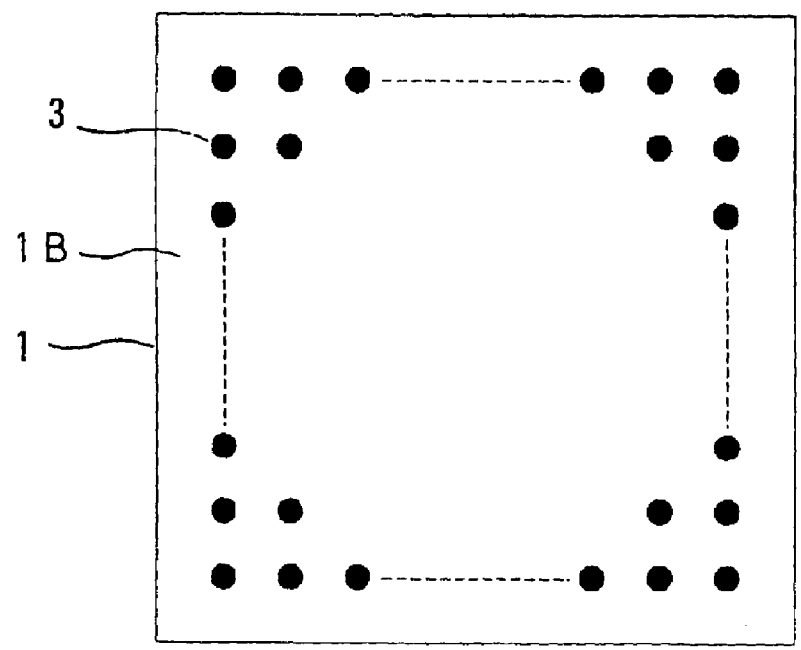
FIG. 19 illustrates the arranged state of other-side-electrodes to be inspected of the circuit board to be inspected shown in FIG. 18.

The circuit board 1 to be inspected in this embodiment is a printed circuit board used in an LSI package such as BGA or CSP and has a great number of semi-spherical, one-side-electrodes 2 to be inspected, which are arranged at high density in the form of a square frame according to a pattern corresponding to a pattern of surface electrodes of a semiconductor chip mounted thereon at a central part of a surface 1A thereof as illustrated in FIG. 18, and projected from the surface 1A, and on the other surface 1B thereof, a great number of disk-like, other-side-electrodes 3 to be inspected, which are arranged at positions of, for example, lattice point having a pitch of 0.5 mm as illustrated in FIG. 19. These other-side-electrodes 3 to be inspected are electrically connected to their corresponding one-side-electrodes 2 to be inspected, respectively.

In the upper-side adaptor 40, a connector 10 for measurement of electric resistance having the construction shown in, for example, FIG. 1, which is brought into contact under pressure with said one surface of the circuit board 1 to be inspected, is provided. The external leading terminal 18 of this connector 10 for measurement of electric resistance is electrically connected to a tester 59.

On the back surface (upper surface in FIG. 16) of the connector 10 for measurement of electric resistance, i.e., on the back-side anisotropically conductive elastomer layer, is arranged a one-side circuit board 41 for inspection. A plurality of inspection electrodes 42 are arranged on a front surface (lower surface in FIG. 16) of this one-side circuit board 41 for inspection according to a pattern corresponding to the pattern of the one-side-electrodes 2 to be inspected of the circuit board 1 to be inspected. Each of the inspection electrodes 42 is electrically connected to the tester 59 through a wiring circuit 44 of the one-side circuit board 41 for inspection and a connector 43.

On the back surface (upper surface in FIG. 16) of the one-side circuit board 41 for inspection, is arranged a pressing plate 45 for pressing the upper-side adaptor 40 downward through an elastic cushioning plate 46 made of, for example, foamed polyurethane, foamed rubber or the like to lower it.

In the lower-side adaptor 50, an other-side circuit board 51 for inspection is arranged, and a pair of inspection electrodes composed of an inspection electrode 52 for current supply and an inspection electrode 53 for voltage measurement, which are arranged with a space from each other, are arranged on the front surface (upper surface in FIG. 16) of the other-side circuit board 51 for inspection for each of the other-side-electrodes 3 to be inspected, according to a pattern corresponding to the arrangement pattern of the other-side-electrodes 3 to be inspected of the circuit board 1 to be inspected so as to be located within a region of an area equivalent to the region occupied by the other side electrode 3 to be inspected. Each of the inspection electrode 52 for current supply and the inspection electrode 53 for voltage measurement of the pair of inspection electrodes are electrically connected to the tester 59 through their corresponding wiring circuits 55 of the other-side circuit board 51 for inspection and a connector 54.

On the front surface of the other-side circuit board 51 for inspection, are provided common elastic connecting members 56 which come into contact with surfaces (upper surface in FIG. 16) of both inspection electrode 52 for current supply and inspection electrode 53 for voltage measurement, which constitute the pair of inspection electrodes. The elastic connecting members 56 are held by a sheet-like holding member 57 provided on the front surface of the other-side circuit board 51 for inspection in a state that its surface (upper surface in FIG. 16) has projected from the surface of the holding member 57. In the embodiment illustrated in FIG. 16, a plurality of the elastic connecting members 56 are provided independently of each other, corresponding to each of the other-side-electrodes 3 to be inspected in the circuit board 1 to be inspected.

A pressing plate 58 for pressing the lower-side adaptor 50 upward to lift it is arranged on the back surface (lower surface in FIG. 16) of the other-side circuit board 51 for inspection.

The elastic connecting members 56 are preferably formed by, for example, an anisotropically conductive elastomer that exhibits high conductivity in its thickness-wise direction. In such an anisotropically conductive elastomer, for example, conductive particles are filled into an insulating elastic polymeric substance in a state oriented so as to align in the thickness-wise direction (vertical direction in the drawings), thereby exhibiting high conductivity in the thickness-wise direction. In particular, a pressure-sensitive anisotropically conductive elastomer that conductive paths extending in the thickness-wise direction are formed when it is pressurized and compressed in the thickness-wise direction is preferred.

Such an elastic connecting members 56 can be formed in accordance with any proper process, for example, a process described in Japanese Patent Application Laid-Open No. 2000-74965.

The elastic connecting members 56 preferably have higher conductivity in their thickness-wise direction than that in a plane direction perpendicular to the thickness-wise direction. Specifically, the elastic connecting members 56 preferably have such electrical properties that a ratio of the electric resistance value in the thickness-wise direction to the electric resistance value in the plane direction is 1 or lower, particularly 0.5 or lower.

If the ratio exceeds 1, a current flowing between the inspection electrode 52 for current supply and the inspection electrode 53 for voltage measurement through the elastic connecting member 56 becomes high, so that it may be difficult in some cases to measure electric resistance with high precision.

From such a point of view, when the elastic connecting member 56 is formed by causing conductive particles to be contained in an insulating elastic polymeric substance, the filled proportion of the conductive particles is preferably 5 to 50% by volume.

A clearance between the inspection electrode 52 for current supply and the inspection electrode 53 for voltage measurement in the other-side circuit board 51 for inspection is preferably at least 10 $\mu$m. If this clearance is shorter than 10 $\mu$m, a current flowing between the inspection electrode 52 for current supply and the inspection electrode 53 for voltage measurement through the elastic connecting member 56 becomes high, so that it may be difficult in some cases to measure electric resistance with high precision.

On the other hand, the upper limit of the clearance is determined by the sizes of the respective inspection electrodes and the size and pitch of their related other-side-electrodes 3 to be inspected, and is generally at most 500 $\mu$m. If this clearance is too long, it may be difficult in some cases to suitably arrange the both inspection electrodes against to one of the other-side-electrodes 3 to be inspected.

In such an electric resistance-measuring apparatus for circuit boards as described above, an electric resistance between an proper one-side-electrode 2 to be inspected and its corresponding other-side-electrode 3 to be inspected in a circuit board 1 to be inspected is measured in the following manner.

The circuit board 1 to be inspected is arranged at the necessary position between the upper-side adaptor 40 and the lower-side adaptor 50, and in this state, the upper-side adaptor 40 is pressed by the pressing plate 45 through the elastic cushioning plate 46 to be lowered, and the lower-side adaptor 50 is pressed by the pressing plate 58 to be lifted, thereby bringing the connector 10 for measurement of electric resistance of the upper-side adaptor 40 into contact under pressure with one surface of the circuit board 1 to be inspected and at the same time, bringing the elastic connecting members 56 of the lower-side adaptor 50 into contact under pressure with the other surface of the circuit board 1 to be inspected. At this time, the movable electrodes 15 in the connector 10 for measurement of electric resistance are moved in a direction toward the back surface from the front surface of the insulating sheet body 12 according to the projected heights of the one-side-electrodes 2 to be inspected of the circuit board 1 to be inspected by the pressing force transmitted through the conductive path-forming portions 21 of the front-side anisotropically conductive elastomer layer 20. This state is the measurable state.

Specifically described with reference to FIG. 17, in this measurable state, the movable electrodes 15 and stationary electrodes 16 are electrically connected at the same time to their corresponding one-side-electrodes 2 to be inspected of the circuit board 1 to be inspected through the conductive path-forming portions 21 of the front-side anisotropically conductive elastomer layer 20 in the connector 10 for measurement of electric resistance pressed by the one-side-electrodes 2 to be inspected. Further, the inspection electrodes 42 of the one-side circuit board 41 for inspection are electrically connected to their corresponding movable electrodes 15 through the conductive path-forming portions 26 of the back-side anisotropically conductive elastomer layer 25. The movable electrodes 15 and stationary electrodes 16 are electrically independent of each other.

On the other hand, pairs of inspection electrodes, which each consist of the inspection electrode 52 for current supply and the inspection electrode 53 for voltage measurement are electrically connected to their corresponding other-side-electrodes 3 to be inspected of the circuit board 1 to be inspected through the elastic connecting member 56.

In such a state, one of a plurality of the one-side-electrodes 2 to be inspected in the circuit board 1 to be inspected is designated, and one of the movable electrode 15 and stationary electrode 16 electrically connected to this designated one-side-electrode 2 to be inspected is used as an electrode for current supply, and the other is used as an electrode for voltage measurement, whereby a current is supplied between the movable electrode 15 or stationary electrode 16 used as the electrode for current supply and the inspection electrode 52 for current supply of the pair of inspection electrodes electrically connected to the other-side-electrode 3 to be inspected corresponding to the designated one-side-electrode 2 to be inspected, and at the same time, voltage between the movable electrode 15 or stationary electrode 16 used as the electrode for voltage measurement and the inspection electrode 53 for voltage measurement of the pair of inspection electrodes electrically connected to the other-side-electrode 3 to be inspected corresponding to the designated one-side-electrode 2 to be inspected is measured, thereby permitting to perform the measurement of an electric resistance between the designated one-side-electrode 2 to be inspected and its corresponding other-side-electrode 3 to be inspected.

According to the electric resistance-measuring apparatus for circuit boards of the above-described construction, both movable electrode 15 and stationary electrode 16 in the composite electrode sheet 11 in the connector 10 for measurement of electric resistance are electrically connected to one of the one-side-electrodes 2 to be inspected at the same time when the front-side anisotropically conductive elastomer layer 20 in the connector 10 for measurement of electric resistance is pressed by the every one-side-electrodes 2 to be inspected in the circuit board 1 to be inspected, the electric resistance of which should be measured. In addition, since the movable electrode 15 and stationary electrode 16 are electrically independent of each other, one of the movable electrode 15 and stationary electrode 16 electrically connected to the one-side-electrode 2 to be inspected is used as an electrode for current supply, and the other is used as an electrode for voltage measurement, whereby an electric resistance as to the circuit board 1 to be inspected can be measured with high precision.

The movable electrodes 15 in the composite electrode sheet 11 in the connector 10 for measurement of electric resistance are supported movably in the thickness-wise direction of the insulating sheet body 12, whereby the movable electrodes 15 are moved in the thickness-wise direction according to the projected heights of the one-side-electrodes 2 to be inspected when the front-side anisotropically conductive elastomer layer 20 is pressed by all the one-side-electrodes 2 to be inspected, so that the irregularity-absorbing ability in each of the front-side anisotropically conductive elastomer layer 20 and back-side anisotropically conductive elastomer layer 25 in the connector 10 for measurement of electric resistance can be effectively utilized. In addition, the thickness of each of the front-side anisotropically conductive elastomer layer 20 and back-side anisotropically conductive elastomer layer 25 may be small, so that high-sensitivity pressure-sensitive conductivity can be achieved in each of the front-side anisotropically conductive elastomer layer 20 and back-side anisotropically conductive elastomer layer 25. Accordingly, high connection reliability can be achieved even to a circuit board 1 to be inspected, which has protruding one-side-electrodes 2 to be inspected projected from a surface of the circuit board, a scatter of projected heights of said electrodes 2 to be inspected being great, so that the required measurement of electric resistance can be surely performed.

Since the stationary electrodes 16 on the composite sheet 11 in the connector 10 for measurement of electric resistance are electrically connected to the tester 59 through the external leading terminal 18, and only the inspection electrodes 42 electrically connected to the movable electrodes 15 through the back-side anisotropically conductive elastomer layer 25 are provided on the one-side circuit board 41 for inspection, the inspection electrodes 42 of the one-side circuit board 41 for inspection are in corresponding relation of one to one against the one-side-electrodes 2 to be inspected in the circuit board 1 to be inspected. Therefore, these electrodes are only required to have a size substantially equal to the one-side-electrodes 2 to be inspected, so that even when the size of the one-side-electrodes 2 to be inspected in the circuit board 1 to be inspected is small, the inspection electrodes 42 corresponding to the one-side-electrodes 2 to be inspected can be formed with ease. As a result, the electric resistance-measuring apparatus can be produced with extreme ease.

The electric resistance-measuring apparatus for circuit boards according to the present invention is not limited to the above described embodiments, and such various modifications as described below may be added thereto.

(1) Those mentioned as the modified examples of the connector 10 for measurement of electric resistance may be used as the connector 10 for measurement of electric resistance in place of the connector of the construction shown in FIG. 1.

(2) As the other-side circuit board for inspection of the lower-side adapter, various types thereof may be used so far as a state that an inspection electrode 52 for current supply and an inspection electrode 53 for voltage measurement constituting a pair of inspection electrodes have been electrically connected to one of the other-side-electrodes 3 to be inspected can be achieved.

Figure 20:
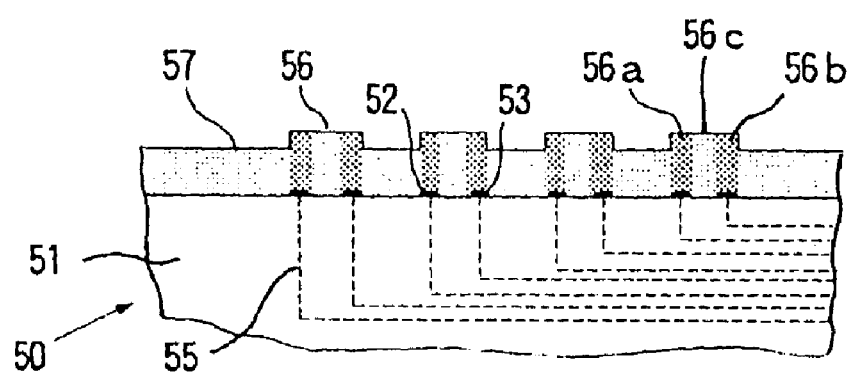
FIG. 20 is a cross-sectional view, on an enlarged scale, illustrating the construction of another embodiment of lower-side adaptor.

For example, as the elastic connecting member 56, there may be used an anisotropically conductive elastomer having conductive path-forming portions 56a and 56b, which extend, independently of each other, in the thickness-wise direction at positions corresponding to the inspection electrode 52 for current supply and the inspection electrode 53 for voltage measurement, and an insulating portion 56c for electrically insulating the conductive path-forming portions 56a and 56b from each other as illustrated in FIG. 20.

Inspection electrodes on the tips of which a conductive elastomer is provided, and further probe pins, if permitted, may also be used as inspection electrodes.

(3) As the lower-side adaptor, there may be used that composed of an other-side circuit board for inspection, on the surface of which inspection electrodes are arranged according to a pattern corresponding to the other-side-electrodes 3 to be inspected in the circuit board 1 to be inspected, and such a connector for measurement of electric resistance as shown in FIG. 1, for example, which is provided on the surface of the other-side circuit board for inspection. The electric resistance-measuring apparatus of such construction is suitable for use in measurement of electric resistance as to a circuit board to be inspected, on which other-side-electrodes to be inspected projected from the other side thereof have been formed.

Figure 21:
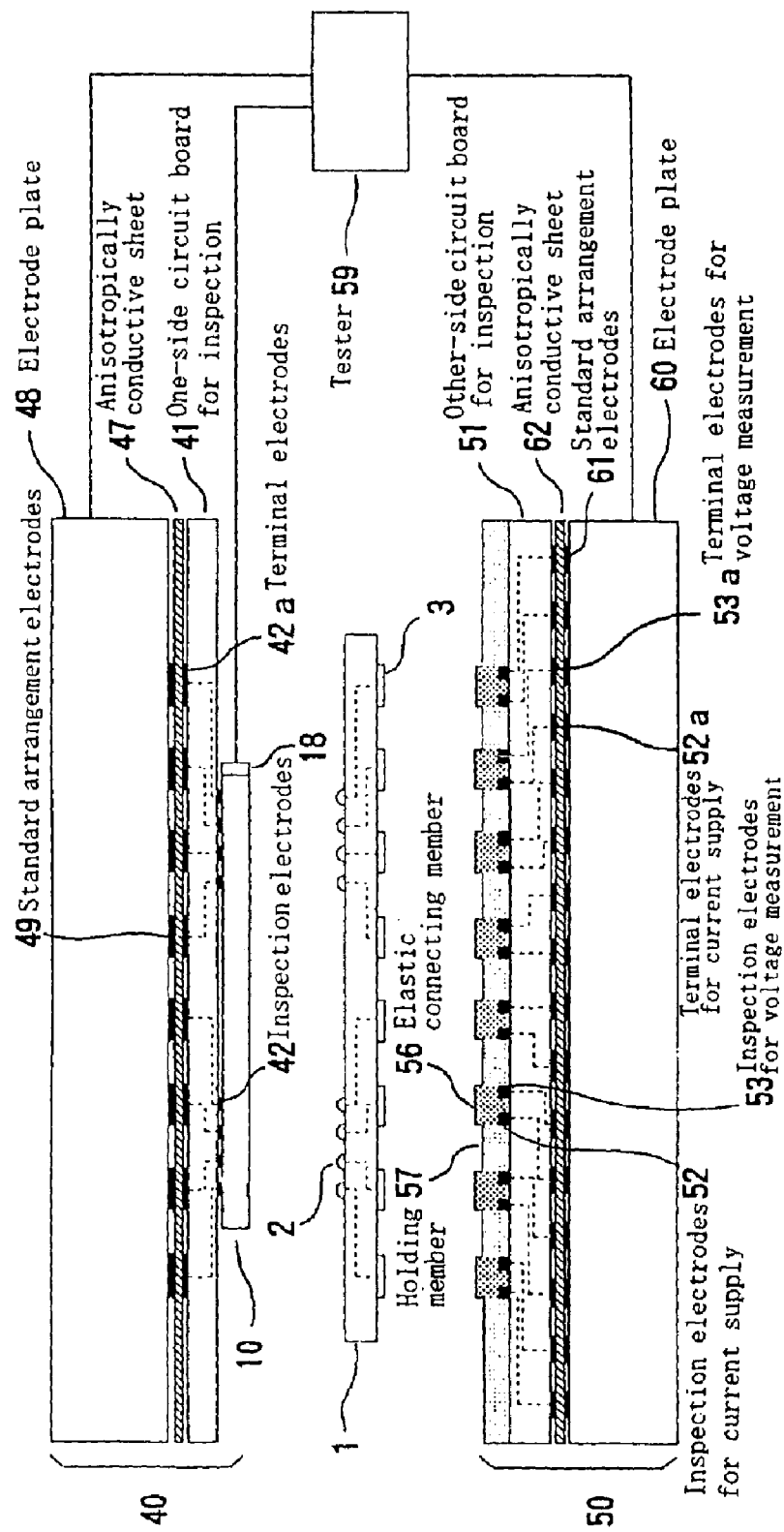
FIG. 21 is a cross-sectional view schematically illustrating the construction of another embodiment of an electric resistance-measuring apparatus for circuit boards according to the present invention together with a circuit board to be inspected.
Figure 22:
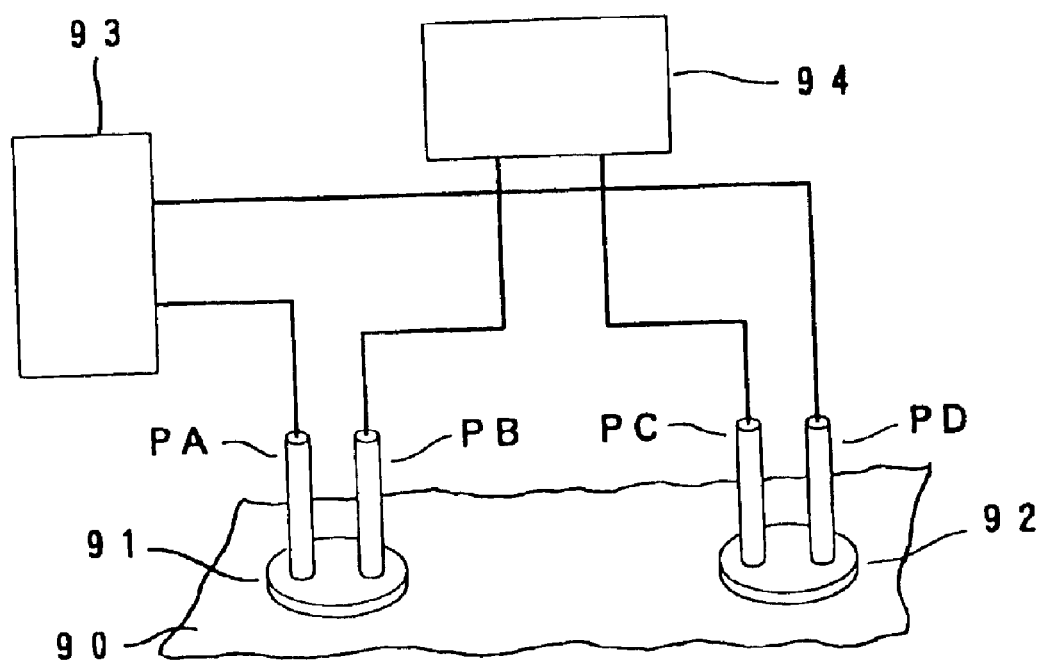
FIG. 22 schematically illustrates an apparatus for measuring an electric resistance between electrodes in a circuit board by probes for current supply and probes for voltage measurement.

(4) The electric resistance-measuring apparatus for circuit boards according to the present invention may also have such a structure as illustrated in FIG. 21.

Specifically described, in this electric resistance-measuring apparatus for circuit boards, an upper-side adapter 40 arranged on one side surface (upper surface in FIG. 21) of a circuit board 1 to be inspected and a lower-side adapter 50 arranged on the other side surface (lower surface in FIG. 21) of the circuit board 1 to be inspected are vertically arranged in opposed relation to each other.

In the upper-side adaptor 40, a connector 10 for measurement of electric resistance having the construction shown in, for example, FIG. 1, which is brought into contact under pressure with said one surface of the circuit board 1 to be inspected, is provided. The external leading terminal 18 of this connector 10 for measurement of electric resistance is electrically connected to a tester 59.

On the back surface (upper surface in FIG. 21) of the connector 10 for measurement of electric resistance, i.e., on the back-side anisotropically conductive elastomer layer, is arranged a one-side circuit board 41 for inspection. A plurality of inspection electrodes 42 are arranged on a front surface (lower surface in FIG. 21) of this one-side circuit board 41 for inspection according to a pattern corresponding to the pattern of the one-side-electrodes 2 to be inspected of the circuit board 1 to be inspected, and terminal electrodes 42a are arranged according to a pattern corresponding to the arrangement pattern of standard arrangement electrodes 49 of an electrode plate 48, which will be described subsequently, on the back surface (upper surface in FIG. 21) of the one-side circuit board 41 for inspection. The terminal electrodes 42a are electrically connected to their corresponding inspection electrodes 42.

The electrode plate 48 is provided on the back surface of the one-side circuit board 41 for inspection through an anisotropically conductive sheet 47. The electrode plate 48 has, on the surface thereof (lower surface in FIG. 21), the standard arrangement electrode 49 arranged on standard lattice points having a pitch of, for example, 2.54 mm, 1.8 mm or 1.27 mm. The standard arrangement electrodes 49 are respectively electrically connected to the terminal electrodes 42a of the one-side circuit board 41 for inspection through the anisotropically conductive sheet 47 and to a tester 59 through inner wiring (not illustrated) of the electrode plate 48.

In the anisotropically conductive sheet 47, conductive path-forming portions that form conductive paths only in the thickness-wise direction thereof are formed. As such an anisotropically conductive sheet 47, it is preferred that each conductive path-forming portion is formed so as to project in the thickness-wise direction on at least one surface in that high electrical contact stability is exhibited.

In the lower-side adaptor 50, an other-side circuit board 51 for inspection is arranged, and an inspection electrode 52 for current supply and an inspection electrode 53 for voltage measurement, which constitute a pair of inspection electrodes, are arranged with a space from each other on the front surface (upper surface in FIG. 21) of the other-side circuit board 51 for inspection correspondingly to one of the other-side-electrodes 3 to be inspected according to a pattern corresponding to the arrangement pattern of the other-side-electrodes 3 to be inspected of the circuit board 1 to be inspected so as to be located within a region of an area equivalent to the region occupied by the other-side-electrode 3 to be inspected. On the other hand, terminal electrodes 52a for current supply and terminal electrodes 53a for voltage measurement are arranged according to a pattern corresponding to the arrangement pattern of standard arrangement electrodes 61 of an electrode plate 60, which will be described subsequently, on the back surface of the other-side circuit board 51 for inspection. These terminal electrodes 52a for current supply and terminal electrodes 53a for voltage measurement are electrically connected to their corresponding inspection electrodes 52 for current supply and inspection electrodes 53 for voltage measurement.

On the front surface of the other-side circuit board 51 for inspection, are provided common elastic connecting members 56 which each come into contact with surfaces of both inspection electrode 52 for current supply and inspection electrode 53 for voltage measurement, which constitute the pair of inspection electrodes. The elastic connecting members 56 are held by a sheet-like holding member 57 provided on the front surface of the other-side circuit board 51 for inspection in a state that its surface has projected from the surface of the holding member 57. In the embodiment illustrated in FIG. 21, a plurality of the elastic connecting members 56, independently of each other, are provided corresponding to the every other-side-electrodes 3 to be inspected in the circuit board 1 to be inspected.

The electrode plate 60 is provided on the back surface (lower surface in FIG. 21) of the other-side circuit board 51 for inspection through an anisotropically conductive sheet 62.

The electrode plate 60 and anisotropically conductive sheet 62 correspond to the electrode plate 48 and anisotropically conductive sheet 47 in the upper-side adaptor 40, respectively. The electrode plate 60 has, on the surface thereof (upper surface in FIG. 21), the standard arrangement electrode 61 arranged on standard lattice points having a pitch of, for example, 2.54 mm, 1.8 mm or 1.27 mm. The standard arrangement electrodes 61 are respectively electrically connected to the terminal electrode 52a for current supply or the terminal electrode 53a for voltage measurement of the other-side circuit board 51 for inspection through the anisotropically conductive sheet 62 and to the tester 59 through inner wiring (not illustrated) of the electrode plate 60.

In the above-described electric resistance-measuring apparatus for circuit boards, an electric resistance between an proper one-side-electrode 2 to be inspected and its corresponding other-side-electrode 3 to be inspected in a circuit board 1 to be inspected is measured in the same manner as in the electric resistance-measuring apparatus shown in FIG. 16.

According to such an electric resistance-measuring apparatus for circuit boards, the same effects as in the electric resistance-measuring apparatus shown in FIG. 16 are achieved, and moreover inspection cost can be reduced since the anisotropically conductive sheet 47 and electrode plate 48 in the upper-side adapter 40, and the anisotropically conductive sheet 62 and electrode plate 60 in the lower-side adapter 50 can be used commonly even when electric resistance of circuit boards to be inspected, which are different in the arrangement pattern of one-side-electrodes 2 to be inspected and other-side-electrodes 3 to be inspected, is measured.

The electric resistance-measuring apparatus for circuit boards according to the present invention will hereinafter be described specifically by the following Examples.

In the following Examples, those produced under the following conditions were used as circuit boards to be inspected.

[One-side-electrodes to be Inspected]
Electrode shape: semi-sphere; Electrode size: 0.12 mm in diameter; Projected height: 0.1 mm; arrangement pitch: 0.25 mm; the number of electrodes: 500.

[Other-side-electrodes to be Inspected]
Electrode shape: disk; Electrode size: 0.5 mm in diameter; arrangement pitch: 1 mm; the number of electrodes: 500.

EXAMPLE 1

An electric resistance-measuring apparatus for circuit boards was produced under the following conditions in accordance with the construction illustrated in FIGS. 16 and 17.

(1) Upper-side Adapter:
[One-side Circuit Board for Inspection on One Side]
 Shape and dimensions of inspection electrodes:
 circle, 0.12 mm in diameter.
 Pitch between inspection electrodes:
 0.25 mm.
[Connector for Measurement of Electric Resistance]
 Composite electrode sheet: Material of insulating sheet body; polyimide, Thickness of insulating sheet body; 0.05 mm, Shape of through-holes; truncated cone, Diameter of opening on the front side; 0.08 mm, Diameter of opening on the back side; 0.12 mm, Material of movable electrodes; nickel, Material of stationary electrodes; copper, The number of openings of through-holes surrounded by one stationary electrode; 1 in the minimum and 40 in the maximum.
 Front-side anisotropically conductive elastomer layer: Material of elastomer; silicone rubber, Thickness; 0.05 mm, Diameter of conductive path-forming portions; 0.1 mm, Conductive particles; nickel particle plated with gold on their surfaces (number average particle diameter; 15 µm), Proportion of conductive particle in conductive path-forming portion: 35% by volume.
 Back-side anisotropically conductive elastomer layer: Material of elastomer; silicone rubber, Thickness; 0.1 mm, Diameter of conductive path-forming portions; 0.12 mm, Conductive particles; nickel particle plated with gold on their surfaces (number average particle diameter; 25 µm), Proportion of conductive particle in conductive path-forming portion: 30% by volume.

(2) Lower-side Adapter:
[Circuit Board for Inspection]
 Size of inspection electrodes for current supply:
 0.2 mm×0.5 mm.
 Size of inspection electrodes for voltage measurement:
 0.2 mm×0.5 mm.
 Clearance between inspection electrodes for current supply and inspection electrode for voltage measurement:
 0.3 mm

[Elastic Connecting Member]

Dimensions: 1.0 mm in diameter; thickness: 0.22 mm,

Conductive particles: nickel particles plated with gold on their surfaces (number average particle diameter: 30 μm), Proportion of conductive particle: 25% by volume, Elastic polymeric substance: silicone rubber.

[Holding Member]

Material: silicone rubber; thickness: 0.1 mm (3) Tester:

"OPEN/LEAK Tester R-5600" (resistance measuring range: 10 mΩ to 100Ω, manufactured by Nidec-Read Corporation).

The electric resistance-measuring apparatus for circuit boards described above was used to bring the front-side anisotropically conductive elastomer layer in the connector for measurement of electric resistance of the upper-side adapter and the elastic connecting members of the lower-side adapter into contact respectively with the one-side-electrodes to be inspected and the other-side-electrodes to be inspected of the circuit board to be inspected. In this state, one of the one-side-electrodes to be inspected was designated, and 2 electrodes, an inspection electrode corresponding to the designated one-side-electrode to be inspected and an inspection electrode adjacent thereto, were selected as a pair of inspection electrodes. One of the selected inspection electrodes was used as an electrode for current supply and the other inspection electrode as an electrode for voltage measurement, thereby measuring an electric resistance between the one-side-electrode to be inspected and the other-side-electrode to be inspected in the circuit board to be inspected to find an error range thereof. The result is shown in Table 1.

COMPARATIVE EXAMPLE 1

An electric resistance-measuring apparatus was produced in the same manner as in Example 1 except that an elastic connecting member composed of the following conductive elastomer sheet was arranged in place of the connector for measurement of electric resistance. Two electrodes among the plural of inspection electrodes electrically connected to the one-side-electrodes to be inspected in the circuit board to be inspected through the elastic connecting member were selected, and one of the selected inspection electrodes was used as an electrode for current supply and the other electrode was used as an electrode for voltage measurement, thereby measuring an electric resistance between the one-side-electrode to be inspected and the other-side-electrode to be inspected in the circuit board to be inspected. The result is shown in Table 1.

[Conductive Elastomer Sheet]

A sheet with conductive particles exhibiting magnetism contained in silicone rubber in a state oriented so as to align in the thickness-wise direction thereof. Conductive particles: nickel particles plated with gold on their surfaces (number average particle diameter: 25 μm) Proportion of conductive particle: 40% by volume, Thickness of the sheet: 0.2 mm.

REFERENTIAL EXAMPLE 1

An electric resistance meter, "TR6143" (manufactured by ADVANTEST CORP.) was used to measure an electric resistance between the one-side-electrode to be inspected and the other-side-electrode to be inspected in the circuit board to be inspected by the four probe method of the resistance measurement using probe pins, thereby finding an error range thereof. The result is shown in Table 1.

REFERENTIAL EXAMPLE 2

The same tester as that used in Example 1 was used to measure an electric resistance between the one-side-electrode to be inspected and the other-side-electrode to be inspected in the circuit board to be inspected by the two probe method of the resistance measurement, thereby finding an error range thereof. The result is shown in Table 1.

TABLE 1

|  | Error range of measurement of an electric resistance |
| --- | --- |
| Example 1 | ±10 mΩ |
| Comparative Example 1 | ±100 mΩ |
| Referential Example 1 | ±10 mΩ |
| Referential Example 2 | ±20 Ω |

As apparent from the results shown in Table 1, according to the electric resistance-measuring apparatus according to Example 1, electric resistance can be measured in a small error range (±10 mΩ) equivalent to the electric resistance value measured by the four probe method of the resistance measurement using probe pins, and sufficiently high precision is achieved from the viewpoint of practical use.

On the other hand, according to the electric resistance-measuring apparatus according to Comparative Example 1, a great error was caused compared with the electric resistance value measured by the four probe method of the resistance measurement using probe pins.

EFFECTS OF THE INVENTION

According to the connector for the measurement of the electric resistance according to the present invention, there can be constructed an electric resistance-measuring apparatus capable of performing expected measurement of an electric resistance surely on electrodes to be inspected with high precision even to a circuit board which has small-sized, protruding electrodes to be inspected projected from a surface of the circuit board, a scatter of projected heights of said electrodes to be inspected being great, and easy to produce.

According to the electric resistance-measuring apparatus for circuit boards according to the present invention, expected measurement of an electric resistance on electrodes to be inspected can be performed surely with high precision even to a circuit board which has small-sized, protruding electrodes to be inspected projected from a surface of the circuit board, a scatter of projected heights of said electrodes to be inspected being great, and it is easy to produce.

According to the electric resistance-measuring method for circuit boards according to the present invention, expected measurement of an electric resistance on electrodes to be inspected can be performed surely with high precision even to a circuit board which has small-sized, protruding electrodes to be inspected projected from a surface of the circuit board, a scatter of projected heights of said electrodes to be inspected being great.

What is claimed is:

1. A connector for measurement of electric resistance, comprising:

a composite electrode sheet comprising an insulating sheet body in which through-holes extending in a thickness-wise direction of the sheet have been formed at positions corresponding to a pattern of a plurality of electrodes to be inspected in a circuit board to be inspected, an electric resistance of which is configured to be measured, movable electrodes respectively supported movably in the thickness-wise direction of the insulating sheet body within the through-holes in the insulating sheet body, and stationary electrodes formed on a front surface of the insulating sheet body in a vicinity of openings of the through-holes in the insulating sheet body in a state not coming into contact with the movable electrodes;

a front-side anisotropically conductive elastomer layer laminated on the front surface of the composite electrode sheet;

a back-side anisotropically conductive elastomer layer laminated on a back surface of the composite electrode sheet; and an external leading terminal electrically connected to the stationary electrodes in the composite electrode sheet; wherein the movable electrodes and stationary electrodes in the composite electrode sheet are configured to be electrically connected at a same time to corresponding electrodes to be inspected through the front-side anisotropically conductive elastomer layer.

2. The connector for measurement of electric resistance according to claim 1, wherein the through-holes in the insulating sheet body taper to widen from the front surface toward the back surface of the insulating sheet body, a side wall of each of the movable electrodes tapers to conform to the through-hole in the insulating sheet body, and the movable electrode is supported movably in the thickness-wise direction in such that the side wall thereof separates from and comes into contact with an inner wall surface of the through-hole in the insulating sheet body.

3. The connector for measurement of electric resistance according to claim 1, wherein the opening on the front side of each of the through-holes in the insulating sheet body has a diameter smaller than a diameter of each of the electrodes to be inspected.

4. The connector for measurement of electric resistance according to claim 1, wherein each of the stationary electrodes is formed in a region including the vicinity of each of a plurality of the openings of the through-holes in the insulating sheet body, and the stationary electrode is configured to be electrically connected to a plurality of the electrodes to be inspected through the front-side anisotropically conductive elastomer layer.

5. The connector for measurement of electric resistance according to claim 1, wherein at least one of the front-side anisotropically conductive elastomer layer and the back-side anisotropically conductive elastomer layer is formed of a plurality of conductive path-forming portions formed corresponding to a pattern of a plurality of electrodes to be inspected in the circuit board to be inspected, the electric resistance of which is configured be measured, and extending in the thickness-wise direction, and insulating portions for mutually insulating these conductive path-forming portions.

6. The connector for measurement of electric resistance according to claim 5, wherein the conductive path-forming portions in the at least one of the front-side anisotropically conductive elastomer layer and the back-side anisotropically conductive elastomer layer contain conductive particles configured to exhibit magnetism in a state oriented at a high density to align in the thickness-wise direction thereof.

7. The connector for measurement of electric resistance according to claim 6, wherein the movable electrodes comprise a metallic material configured to exhibit magnetism.

8. The connector for measurement of electric resistance according to claim 1, wherein the back-side anisotropically conductive elastomer layer has a thickness greater than a thickness of the front-side anisotropically conductive elastomer layer.

9. The connector for measurement of electric resistance according to claim 1, wherein the back-side anisotropically conductive elastomer layer has a hardness lower than a hardness of the front-side anisotropically conductive elastomer layer.

10. An electric resistance-measuring apparatus for circuit boards, comprising;

the connector for measurement of electric resistance according to any one of claims 1 to 9 arranged on one side of a circuit board to be inspected, the electric resistance of which is configured to be measured, wherein the front-side anisotropically conductive elastomer layer in the connector for measurement of electric resistance is configured to be pressed by every one-side-electrodes to be inspected arranged on the circuit board to be inspected, whereby the movable electrodes and stationary electrodes in the connector for measurement of electric resistance are configured to be electrically connected at the same time to the respective electrodes to be inspected through the front-side anisotropically conductive elastomer layer so that a measurable state is realized, and in this measurable state, one of the movable electrode and stationary electrode electrically connected to one designated one-side-electrode to be inspected is configured to be used as an electrode for current supply, and the other to be used as an electrode for voltage measurement, thereby to perform measurement of electric resistance as to said designated one-side-electrode to be inspected.

11. The electric resistance-measuring apparatus for circuit boards according to claim 10, which comprises a one-side-circuit board for inspection arranged on a back side of the connector for measurement of electric resistance and having a plurality of inspection electrodes arranged respectively corresponding to a plurality of the one-side-electrodes to be inspected of the circuit board to be inspected on its surface, wherein in the measurable state, the respective inspection electrodes are configured to be electrically connected to their corresponding movable electrodes through the back-side anisotropically conductive elastomer layer in the connector for measurement of electric resistance.

12. The electric resistance-measuring apparatus for circuit boards according to claim 10, which comprises an other-side-circuit board for inspection arranged on an other side of the circuit board to be inspected, wherein the other-side-circuit board for inspection has an electrode for current supply and an electrode for voltage measurement which are arranged with a space from each other corresponding to each of the other-side-electrodes to be inspected of the circuit board to be inspected and configured to be electrically connected to a same other-side-electrode to be inspected of the circuit board to be inspected.

13. The electric resistance-measuring apparatus for circuit boards according to claim 11, which comprises an other-side-circuit board for inspection arranged on an other side of the circuit board to be inspected, wherein the other-side-circuit board for inspection has an electrode for current supply and an electrode for voltage measurement which are arranged with a space from each other corresponding to each of the other-side-electrodes to be inspected of the circuit board to be inspected and configured to be electrically connected to a same other-side-electrodes to be inspected of the circuit board to be inspected.

14. The electric resistance-measuring apparatus for circuit boards according to claim 10, in which one-side-electrodes to be inspected of the circuit board to be inspected project from the one side of the circuit board to be inspected.

15. The electric resistance-measuring apparatus for circuit boards according to claim 11, in which one-side-electrodes to be inspected of the circuit board to be inspected project from the one side of the circuit board to be inspected.

16. The electric resistance-measuring apparatus for circuit boards according to claim 12, in which one-side-electrodes to be inspected of the circuit board to be inspected project from the one side of the circuit board to be inspected.

17. The electric resistance-measuring apparatus for circuit boards according to claim 13, in which one-side-electrodes to be inspected of the circuit board to be inspected project from the one side of the circuit board to be inspected.

18. An electric resistance-measuring method for circuit boards, comprising:

arranging the connector for measurement of electric resistance according to any one of claims 1 to 9 on one side of a circuit board to be inspected, the electric resistance of which is configured to be measured, wherein the front-side anisotropically conductive elastomer layer in the connector for measurement of electric resistance is pressed by every one-side-electrodes to be inspected of the circuit board to be inspected, whereby the movable electrodes and stationary electrodes in the connector for measurement of electric resistance are electrically connected at the same time to the respective electrodes to be inspected through the front-side anisotropically conductive elastomer layer so as to realize a measurable state, and in this measurable state, one of the movable electrode and stationary electrode electrically connected to one designated one-side-electrode to be inspected is used as an electrode for current supply, and the other is used as an electrode for voltage measurement, thereby performing measurement of electric resistance as to said designated one-side-electrode to be inspected.

\* \* \* \* \*